US007196574B1

(12) United States Patent
Vishinsky

(10) Patent No.: US 7,196,574 B1
(45) Date of Patent: Mar. 27, 2007

(54) ACTIVE POLYPHASE LADDER FILTERS WITH TRANSMISSION ZEROS AND THEIR SYNTHESIS METHOD

(76) Inventor: Adam S. Vishinsky, 1512 Highland Cir., Little Elm, TX (US) 75068-3787

( * ) Notice: Subject to any disclaimer, the term of this patent is extended or adjusted under 35 U.S.C. 154(b) by 91 days.

(21) Appl. No.: 11/157,945

(22) Filed: Jun. 22, 2005

(51) Int. Cl.
H03K 5/00 (2006.01)
(52) U.S. Cl. .................................. 327/557; 327/552
(58) Field of Classification Search ........ 327/552–559; 330/305
See application file for complete search history.

(56) References Cited

U.S. PATENT DOCUMENTS

| 3,714,603 | A | * | 1/1973 | Williford ..................... 330/109 |
|---|---|---|---|---|
| 4,260,968 | A | * | 4/1981 | Haigh et al. ................. 333/214 |
| 4,696,055 | A | | 9/1987 | Marshall |
| 4,723,318 | A | | 2/1988 | Marshall |
| 4,914,408 | A | | 4/1990 | Voorman |
| 6,035,186 | A | | 3/2000 | Moore et al. |
| 6,184,748 | B1 | * | 2/2001 | Rao et al. ..................... 327/552 |
| 6,300,849 | B1 | * | 10/2001 | Takeda ......................... 333/202 |
| 6,346,850 | B2 | * | 2/2002 | Essink .......................... 327/552 |
| 6,441,682 | B1 | | 8/2002 | Vinn et al. |
| 6,559,741 | B2 | * | 5/2003 | Takeda ......................... 333/204 |
| 6,577,855 | B1 | | 6/2003 | Moore et al. |
| 7,098,731 | B1 | * | 8/2006 | Wyszynski .................. 327/557 |

OTHER PUBLICATIONS

R. Schaumann, M. S. Ghausi, and K. R. Laker, Design of Analog Filters: Passive, Active RC, and Switched Capacoitor, Prentice Hall, pp. 149-158, 1990.

J. D. Schoefler, "The Synthesis of Minimum Sensitivity Networks," IEEE Trans. Circuit Theory, vol. 14, pp. 271-276, 1964.

H. J. Orchard, "Inductorless Filters," Elect. Lett., vol. 2, pp. 224-225, 1966.

M. L. Blostein, "Sensitivity of Parasitic Effects in Resistance-Terminated LC Two-Ports," IEEE Trans. Circuit Theory, vol. 14, pp. 21-25, 1967.

G. C. Temes, "Effects of Semiuniform Losses in Reactance 2-Ports," Elect. Lett., vol. 8, pp. 161-163, 1972.

H. J. Orchard, G. C. Temes, and T. Cataltepe, "Sensitivity Formulas for Terminated Lossless Two-Ports," IEEE Trans. Circ. Syst., vol. CAS-32, pp. 459-466, 1985.

J. Crols and M. Steyaert, CMOS Wireless Transceiver Design, Kluver Academic Publishers, pp. 193-203, 1997.

J. Crols and M. Steyaert, "An Analog Integrated Polyphase Filter for a High Performance Low-IF Receiver,"Proc. IEEE VLSI Circuit Symposium, pp. 87-88, 1995.

(Continued)

*Primary Examiner*—Dinh T. Le
(74) *Attorney, Agent, or Firm*—Locke Liddell & Sapp, LLP

(57) ABSTRACT

Direct incorporation of transmission zeros into a continuous-time active complex BP filter transfer function yields a filter having much sharper roll-off than that of an all-pole filter. The ladder filter is constructed using transconductors and capacitors only. The filter center frequency, its bandwidth and positions of transmission zeros can be electronically varied using tunable transconductors. The positions of zeros are changed by modifying cross-coupled differential transconductors connected between capacitors in parallel with the series inductors. Since all transconductors used in the filter are electronically tunable an automatic tuning system conveniently adjusts the filter center-frequency and its Q-factor.

19 Claims, 28 Drawing Sheets

OTHER PUBLICATIONS

J. Crols and M. Steyaert, "Low-IF Topologies for High Performance Analog Front-Ends of Fully Integrated Receivers," IEEE Trans. Circ. Syst. II: Analog and Digital Signal Processing, vol. 45, pp. 269-282, 1998.

B. Guthrie, T. Sayers, A. Spencer, and J. Hughes, "A CMOS Gyrator Low-IF Filter for a Dual-Mode Bluetooth/Zigbee Transceiver," 2004 IEEE Custom Integrated Circuits Conf., vol. 17, pp. 49-52, May 2004.

J. Kim, S. Cho, and J. Ko, "L1/L2 Dual-Band CMOS GPS Receiver," Proc. of the 30th European Solid-State Circuits Conf., pp. 87-90, Sep. 2004.

IEEE Journal of Solid-State Circuits, vol. 37, pp. 114-124, Feb. 2002.

O. Erdogan, R. Gupta, D. Yee, J. Rudell, J-S. Ko, R. Brockenbrough, S-O. Lee, E. Lei, J. L. Tham, H. Wu, C. Conroy, and B. Kim, "A Single Chip Quad-Band GSM/GPRS Transceiver in 0.18μm Standard CMOS," Proc. IEEE International Solid-State Circuits Conf. ISSCC'2005, pp. 318-319, Feb. 2005.

Andreani, S. Mattisson, and B. Essink; A CMOS gm-C Polyphase Filter with High Image Band Rejection, Proc. IEEE 26th European Solid-State Circuits Conf., pp. 244-247, Sep. 2000.

P. Andreani and S. Mattisson, "On the Use if Nauta's Transconductor in Low-Frequency CMOS gm-C Bandpass Filters," IEEE Journal of Solid-State Circuits, vol. 37, pp. 114-124, Feb. 2002.

V. Prodanov, G. Palaskas, J. Glas, and V. Boccuzzi, "A CMOS AGC-less IF Strip for Bluetooth," Proc. IEEE 27th European Solid-State Circuits Conf., pp. 488-491, Sep. 2001.

W. Sheng, B. Xia, A. E. Emira, C. Xin, A. Y. Valero-López, S. T. Moon, and E. Sánchez-Sinencio, "A 3-V, 0.35-μm CMOS Bluetooth Receicer IC," IEEE Journal of Solid-State Circuits, vol. 38, pp. 30-42, Jan. 2003.

Melly, E. Le Roux, D. Ruffieux, and V. Peiris, "A 0.6mA, 0.9V 100MHz FM Front-End in a 0.18μm CMOS-D Technology," Proc. IEEE 29th European Solid-State Circuits Conf., pp. 417-420, Sep. 2003.

\* cited by examiner $$v \;\; \substack{j\omega C_1 \\ \rule{1cm}{0.4pt}} \;\; -g_{ma} \triangleright jv \quad \equiv \quad j(\omega C_1 - g_{ma}) \quad \equiv \quad j(\omega - \omega_c)C_1$$

$$\omega_c = g_{ma}/C_1$$

ACTIVE POLYPHASE LADDER FILTERS WITH TRANSMISSION ZEROS AND THEIR SYNTHESIS METHOD

TECHNICAL FIELD OF THE INVENTION

The present invention relates to fully-integrated continuous-time active complex band-pass filters with transmission zeros and their synthesis method using transconductance amplifiers and capacitors that allows conversion of a passive ladder prototype of a real lowpass with transmission zeros into an active complex bandpass filter with transmission zeros.

BACKGROUND OF THE INVENTION

Continuous-time active complex bandpass (BP) filters are widely used in the integrated receivers. They serve primarily as intermediate-frequency (IF) channel select filters with additional function of providing image rejection. Their ability to reject unwanted image frequencies of the preceding mixer results directly from their non-symmetrical transfer characteristic. Depending on its input signal conditioning a complex BP filter transmits for positive frequencies and rejects all negative frequencies, or vice-versa, it transmits for negative frequencies and blocks all positive frequencies.

The achievable image-rejection ratio (IRR) depends on the matching of on-chip components used in a complex filter. They include resistors, capacitors and transconductors. Also, non-ideal gain of opamps if used for filter synthesis results in IRR degradation. The IRR performance also depends on the choice of synthesis method. Certain methods are more sensitive to component variation than the others. Practically achievable IRR of a complex filter is 30–35 dB. If extreme caution is taken to achieve an excellent component matching, or if a special automatic compensation scheme is applied the IRR can reach 55–60 dB.

Active complex bandpass filters can be realized using two distinct synthesis methods: the active ladder simulation and the direct synthesis. Similarly to the classical passive LC ladder synthesis method, in the active ladder simulation each pole frequency and its quality (Q) factor are defined by all filter components. Contrary, for the direct synthesis method the pole frequency and its Q factor are defined only by the components of one particular filter section. Due to its lower sensitivity to the component value variation, the active ladder simulation method is superior to the direct synthesis method and it is the preferred method for realization of complex active bandpass filters.

Active complex bandpass filters can also be categorized according to the active synthesis method chosen for their implementation. Two different synthesis techniques have been used so far: the active-RC technique used in U.S. Pat. No. 4,914,408 and the gyrator method used in U.S. Pat. No. 6,346,850. It should be noted that both techniques were widely known prior to their application in the above-mentioned Patents. In active-RC method the transfer function is realized using active-RC integrators built with input series resistors and feedback capacitors around operational amplifiers (opamps). The gyrator method uses voltage-controlled current sources and capacitors to realize integrators. The advantage of the gyrator method over the active-RC method stems from its ability to adjust the filter pole frequencies by adjusting the transconductance with a control voltage or current, which is not easily achievable in a fixed R and C arrangement of the active RC filters.

Due to their prime application as channel select filters complex BP filters must demonstrate sharp roll-off outside their pass-bands. In wireless receiver system design their attenuation determines such critical parameters as co-channel and adjacent channel rejection. Steep roll-off is not easily achievable with all-pole transfer functions. Depending on their Order all-pole transfer functions may be quite steep, but as illustrated in FIG. 16, their roll-off is never as steep as that of filters that contain transmission zeros. For all these reasons, in an integrated receiver design there is a strong need for active complex BP filters with transmission zeros. Ladders offer a wide range of transfer functions: both all-pole prototypes and filters with transmission zeros.

DESCRIPTION OF THE PRIOR ART

The arrangement for a complex all-pole (no transmission zeros) bandpass (BP) active ladder scheme using active-RC integrators such as one described in U.S. Pat. No. 4,914,408 is illustrated in FIG. 1, and is identified by the numeral 10. It consists of two identical banks of active-RC integrators—12 connected by the feedback resistors—14. Without these resistors each of the banks performs a lowpass (LP) function.

The LP filter integrator banks—12 are connected in so called a leapfrog structure as shown in FIG. 2 and identified by the numeral 20, which is a common technique to simulate lossless ladders using active integrators. Two types of integrators are used. Lossy integrators—22 simulate the ladder first element—the source resistor, and the ladder last element—the load resistor. Lossless integrators—24 simulate the reminding ladder elements. Since presented ladder is of third-Order, only one lossless integrator—24 is necessary. Similarly to the classical passive LC ladder synthesis method, in the active ladder simulation a single pole frequency and its quality (Q) factor are defined by all filter elements. Such structures are characterized by low sensitivities of their pole frequencies and Q-factors to component value variation. However, since on-chip RC time-constants can vary as much as 30–40% the accuracy of the cut-off frequency of a LP built with active-RC integrators is similarly low if no tuning is applied.

When the feedback resistors—14 in FIG. 1 are connected, the complex signals shift the LP transfer functions by a frequency $\omega_c$ inversely proportional to the value of feedback resistors. This frequency shift by a vector $j\omega_c$ causes the LP in FIG. 3 that is symmetrical around zero frequency to transform into the non-symmetrical (transmits for positive frequencies only) complex BP as shown in FIG. 4. Again, if no tuning is applied the accuracy of the frequency shift is as low as that of the on-chip RC time constant.

A different arrangement for a complex all-pole (no transmission zeros) BP active ladder simulation scheme built with gyrators is described in U.S. Pat. No. 6,346,850. As illustrated in FIG. 5 a gyrator identified by a numeral 50 consists of two voltage-controlled current sources—52. The gyrator method uses gyrators and capacitors to realize integrators. The complex BP filter is illustrated in FIG. 6 and identified by numeral 60. Similarly to the previous method, it consists of two banks of integrators—62 cross-connected by gyrators—64. Since filter integrators are built with gyrators that consist of voltage-controlled current sources their transconductance can be adjusted to compensate for the process variation of on-chip capacitors and resistors. Also, since this is also an active ladder simulation method a single pole frequency and its quality (Q) factor are defined by all filter elements, which results in low sensitivities of these parameters to component value variation.

Yet another arrangement for a complex all-pole (no transmission zeros) BP active ladder simulation scheme described in U.S. Pat. No. 6,441,682 is illustrated in FIG. 7 and identified by numeral 70. The scheme uses active-RC integrators similar to those described in U.S. Pat. No. 4,914,408 to build LP filters—72, but instead of using fixed resistors to shift the LP function the method uses voltage-controlled current sources—74. The advantage of voltage-controlled current sources over the fixed resistors is that voltage controlled current sources can be adjusted to compensate for unavoidable process variation of on-chip capacitors and resistors. However, since the remaining LP filter circuitry consists of active-RC integrators the accuracy of the LP cutoff frequency, with respect to the process variation, is similar to that of U.S. Pat. No. 4,914,408. Nevertheless, due to using the adjustable voltage-controlled current sources, the accuracy of the complex BP center frequency is expected to be better, similar to that of U.S. Pat. No. 6,346,850.

Different arrangement for a complex all-pole (no transmission zeros) BP filter using the active direct synthesis scheme has been described in a paper by J. Crols and M. Steyaert, "An Analog Integrated Polyphase Filter for High Performance Low-IF Receiver," *Proc. IEEE VLSI Circuit Symposium*, Kyoto, pp. 87–88, 1995 illustrated in FIG. 8 and identified by numeral 80. It is a negative feedback scheme that forms real pole using "−1" operators—82 and then translates the real pole into a pair of complex poles using cross-coupled operators "$\pm\omega_c/\omega_o$"—84. The proposed realization is illustrated in FIG. 9 and identified by numeral 90. Similarly to U.S. Pat. No. 4,914,408 it uses active-RC integrators, but instead of building the whole LP filters transfer function in a ladder structure, each pair of complex poles is realized directly. By using feedback resistors $R_Q$—92 in cross-coupled configuration the pole positions are shifted by a frequency vector. This results in a complex BP transfer function. However, contrary to all previously described methods the individual pole frequency and its Q-factor values are defined by the component values of one particular filter section only. Therefore, the expected sensitivities of the pole parameters to the component value variation are higher than that of the active ladder simulation method. Also, since the pole frequencies are defined by the on-chip RC time constant, without the tuning, the accuracy of the center frequency and the bandwidth of the resulting complex BP is expected to be similarly low as that of U.S. Pat. No. 4,914,408. However, in the presented practical circuit switching on and off binary weighted capacitors—94, provides with the pole tunability.

Practical realizations for active complex all-pole (no transmission zeros) BP filters using both the direct synthesis and active ladder simulation methods have been presented in numerous conference and journal papers. Most of the presented complex BP filters use $g_m$—C technique, some a combination of $g_m$—C and passive RC elements, and some active-RC integrators. Since most of the presented applications for complex active BP filters do not require very steep transfer functions only few attempts to implement transmission zeros have been made up to date.

A practical realization of an active complex all-pole (no transmission zeros) ladder BP filter and the method of converting an all-pole LP ladder prototype into an active all-pole complex BP filter have been presented in a paper by P. Andreani, S. Mattisson, B. Essink; A CMOS $g_m$—C Polyphase Filter with High Image Band Rejection, *Proc.* *IEEE 26th European Solid-State Circuits Conf*, pp. 244–247, September 2000. In particular, the conversion of a passive LP shunt-C series-L shunt-C all-pole third-Order ladder prototype illustrated in FIG. 10 and identified by numeral 100 into an active all-pole third-Order LP ladder structure illustrated in FIG. 11 and identified by numeral 110, and then into an active all-pole sixth-Order complex BP filter illustrated in FIG. 12 and identified by numeral 120 has been demonstrated. For illustration purpose $L_2$ realizations FIGS. 11 and 12 are encircled with a dotted line.

As illustrated in FIG. 13 and identified by numeral 130, in order to obtain a steep transfer function required by some system specifications transmission zeros are introduced by cascading an all-pole LP prototype—132 with a notch prototype—134, and then transforming the two into an active all-pole complex BP and active complex notch pair. This approach results in a sub-optimal solution requiring more circuitry, yielding overall less robust design and worse quality of the implemented transmission zeros that suffer from low Q's (losses) and parasitic capacitance—136 distorting the desired transfer function.

As illustrated in FIG. 14 and identified by numeral 140, a simpler and more robust approach would be to incorporate a transmission zero directly into the original LP ladder transfer function in a form of a series capacitor $C_2$ in parallel with the inductor $L_2$ and then to convert it into an active complex BP filter. Note that using this technique for a fifth-Order LP prototype by adding a capacitor $C_4$—142 in parallel with $L_4$ a second zero can be created, which further improves the steepness of transfer function. Introducing zeros directly into the original LP ladder results also in much better quality of implemented zeros and the elimination of additional loss and parasitic capacitance distorting the desired transfer function. The method of converting a LP ladder prototype with transmission zeros into an active $g_m$-C complex BP filter with transmission zeros will be presented in the present disclosure.

SUMMARY OF THE INVENTION

The present invention is used to implement a fully-integrated continuous-time active complex IF bandpass (BP) filter denoted by numeral 156 in a low-IF wireless receiver such as one identified by numeral 150 in FIG. 15. Contrary, to other methods the present invention allows for direct incorporation of transmission zeros into a complex BP filter transfer function. It is performed by converting a passive real lowpass (LP) ladder prototype with transmission zeros into an active $g_m$-C complex BP filter with transmission zeros. As illustrated in FIG. 16 for a LP prototype, that yields a filter with transmission zeros—161 having much sharper roll-off than that of an all-pole filter—162. The present filter is constructed using transconductors and capacitors only. The filter center frequency, its bandwidth and positions of transmission zeros can be individually tuned using tunable transconductors. Modifying the additional transconductors to those of an active LP prototype changes its center frequency. To change the filter bandwidth only the transconductors of an active LP prototype need to be adjusted. The positions of zeros can be changed separately by modifying the cross-coupled differential transconductors between capacitors in parallel with the series inductors. Since all transconductors used in the present filter are electronically tunable an automatic tuning system can conveniently adjust the filter center-frequency and its Q-factor for process variation.

BRIEF DESCRIPTION OF THE DRAWINGS

For a more complete understanding of the present invention and for further advantages thereof, reference is now made to the following Description of the Preferred Embodiments taken in conjunction with the accompanying Drawings in which:

FIG. 20 is a schematic diagram of a grounded C with a single-ended shifting transconductor illustrating the idea of complex shifting of a grounded C;

DESCRIPTION OF THE PREFERRED EMBODIMENTS

Figure 1:
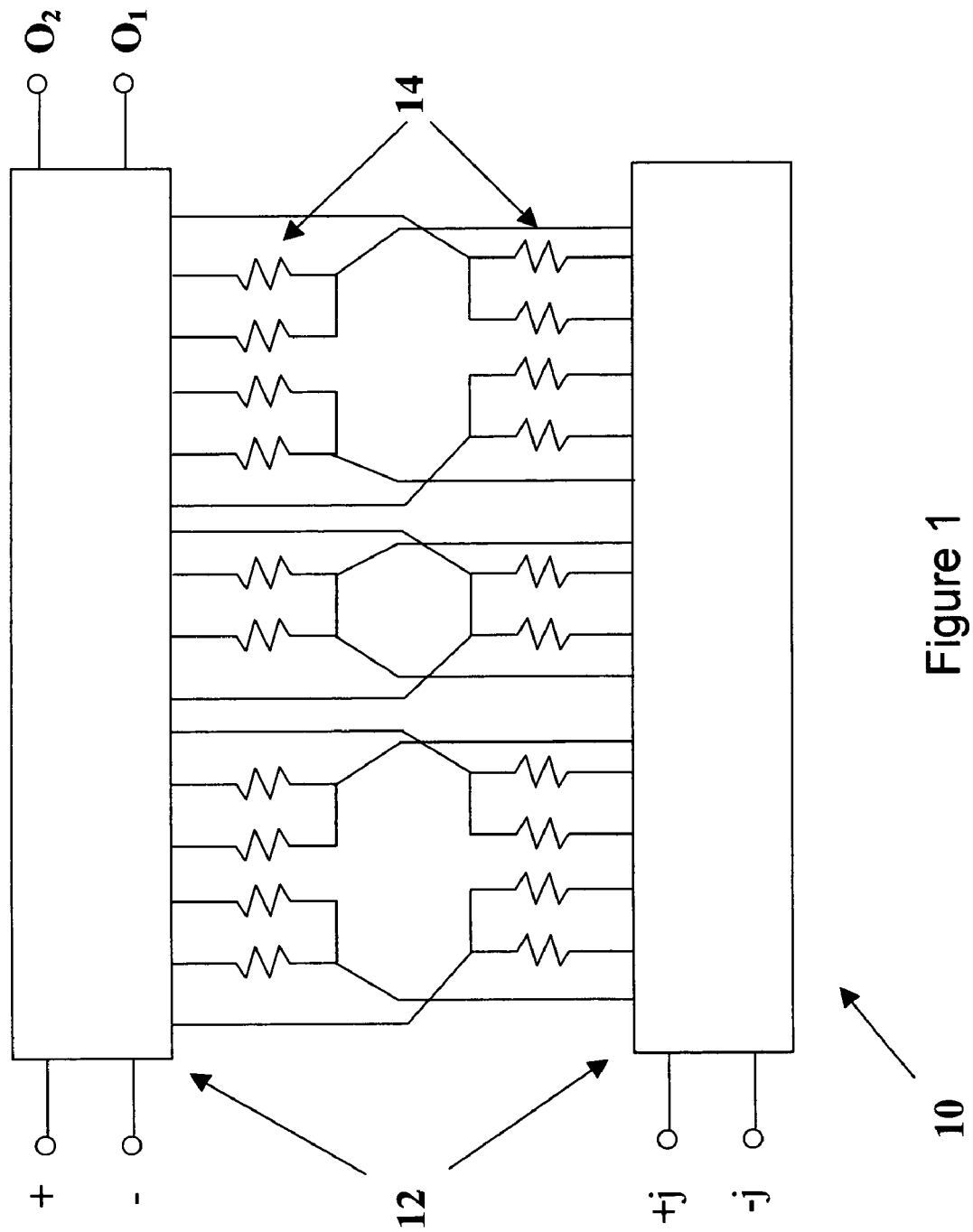
FIG. 1 is a block diagram of a prior art all-pole complex bandpass active ladder.
Figure 2:
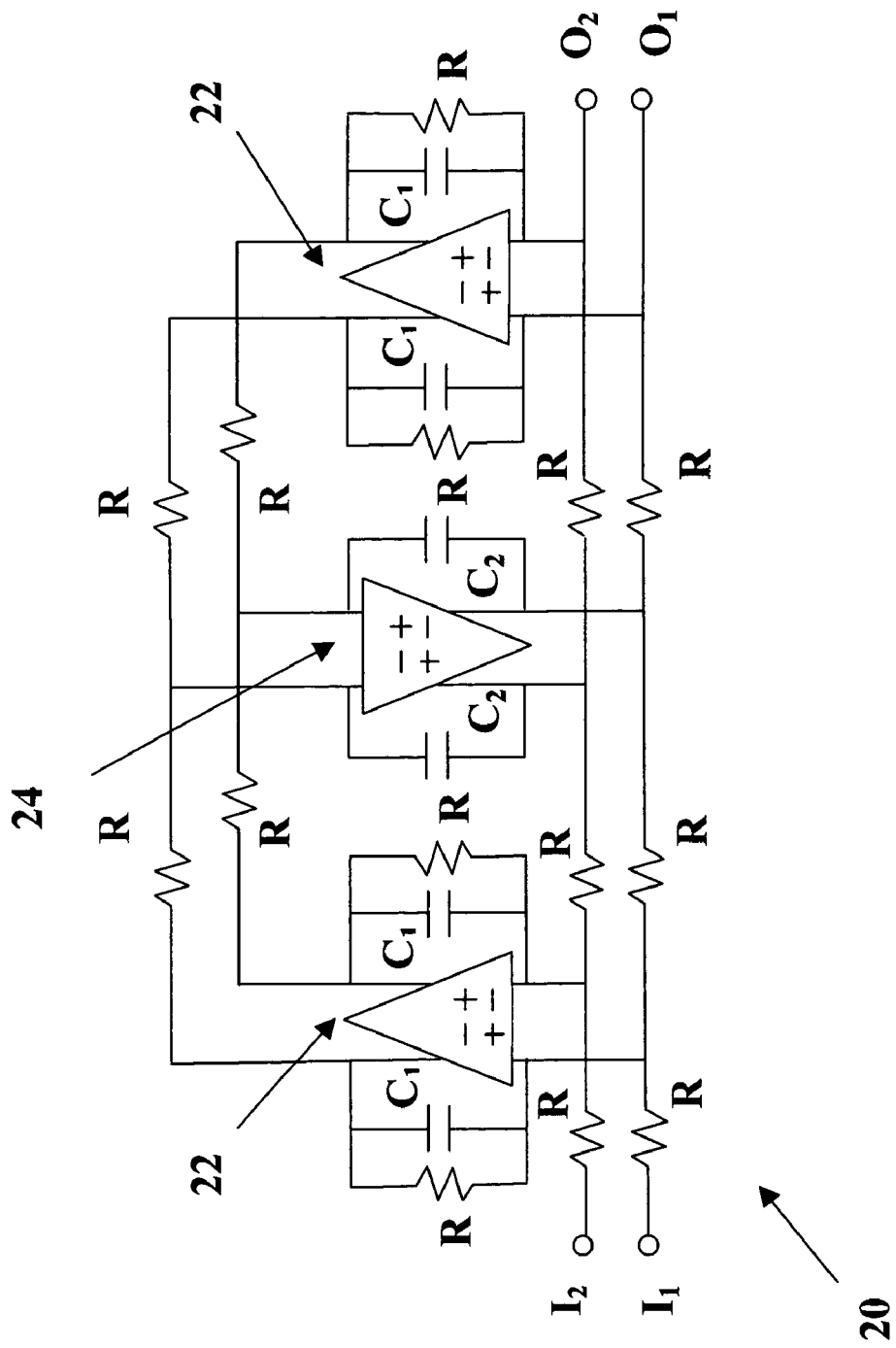
FIG. 2 is a schematic diagram of a prior art all-pole complex bandpass active ladder using active-RC integrators in leapfrog configuration.
Figure 3:
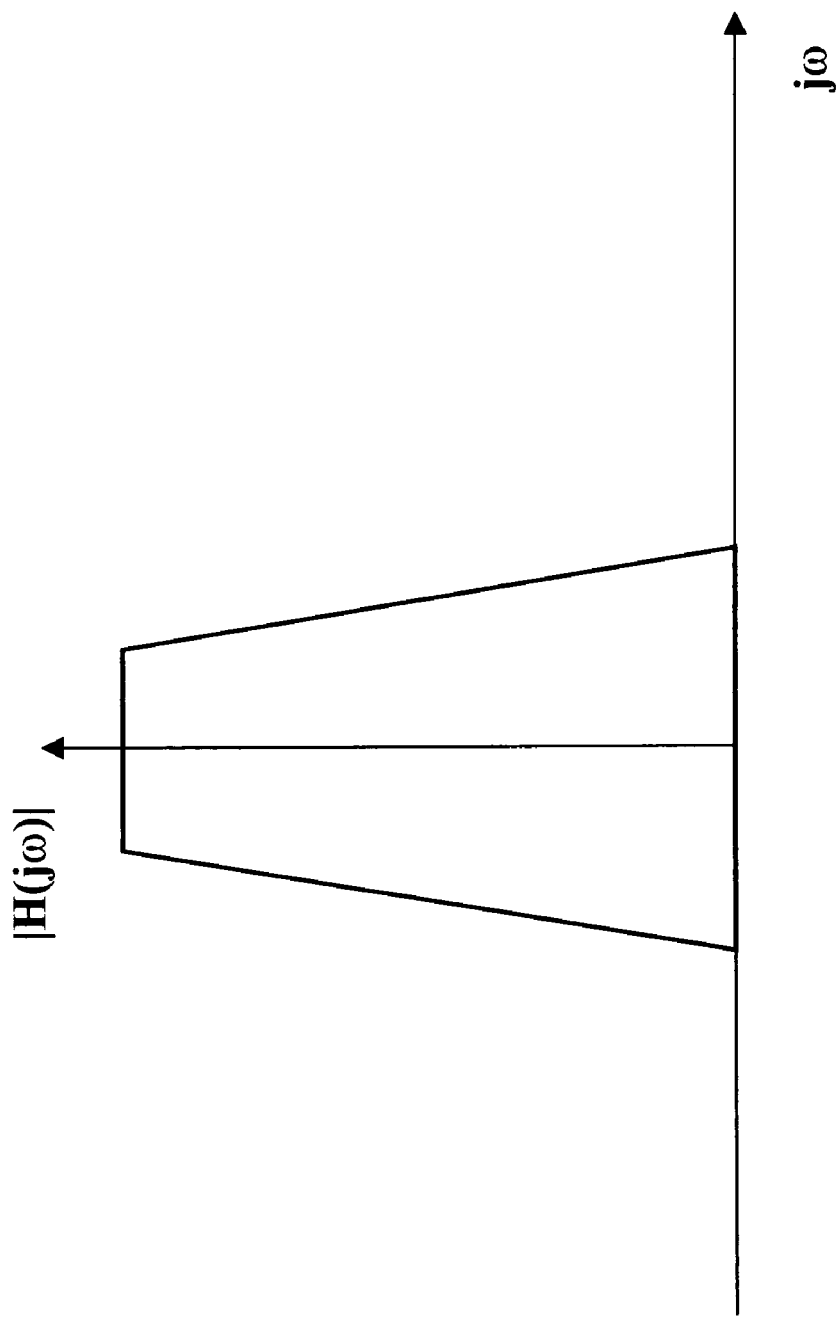
FIG. 3 is an illustration of a prior art real lowpass transfer function.
Figure 4:
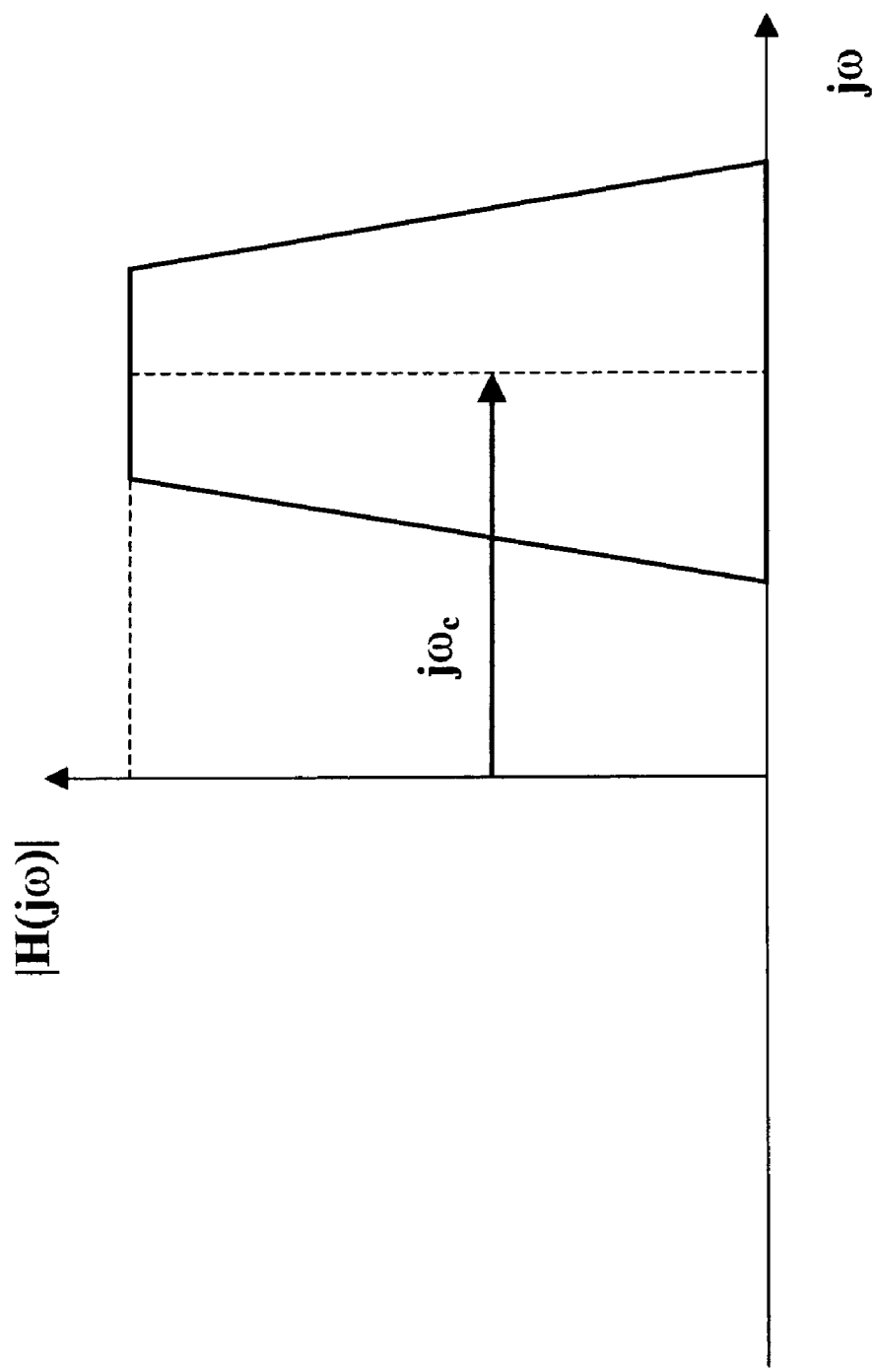
FIG. 4 is an illustration of a prior art real lowpass transfer function shifted by a vector $j\omega_c$ that becomes a complex bandpass transfer function.
Figure 5:
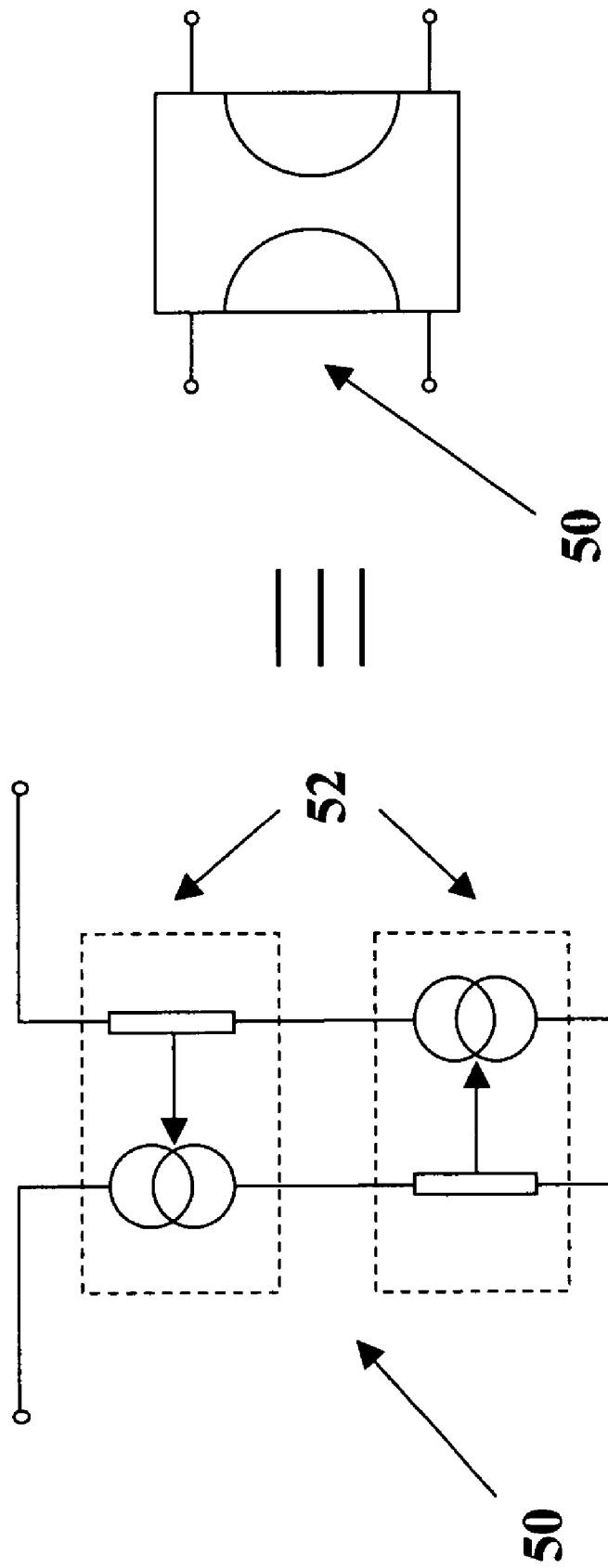
FIG. 5 is a block diagram of a prior art gyrator.
Figure 6:
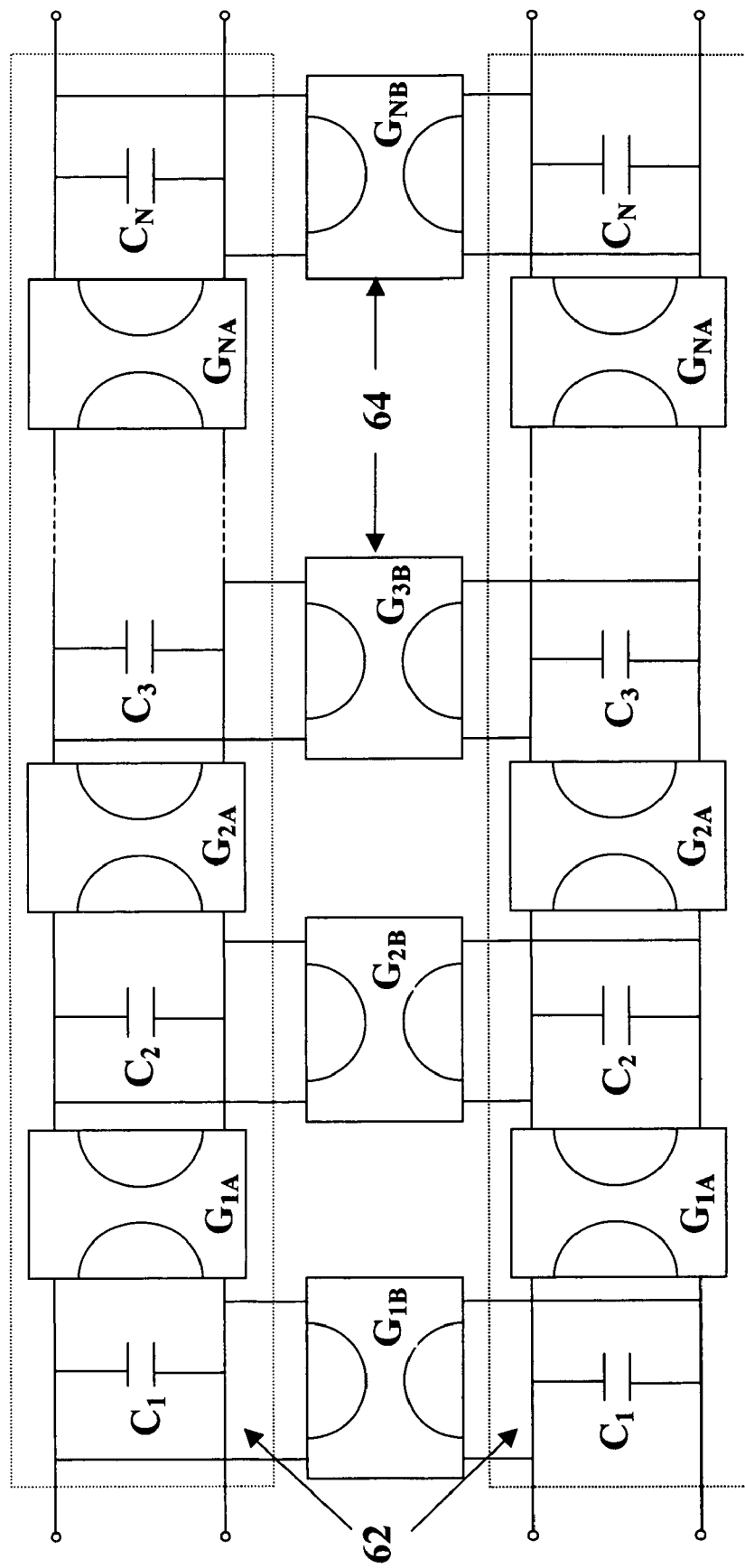
FIG. 6 is a block diagram of a prior art active all-pole complex bandpass ladder filter built with gyrators and capacitors.
Figure 7:
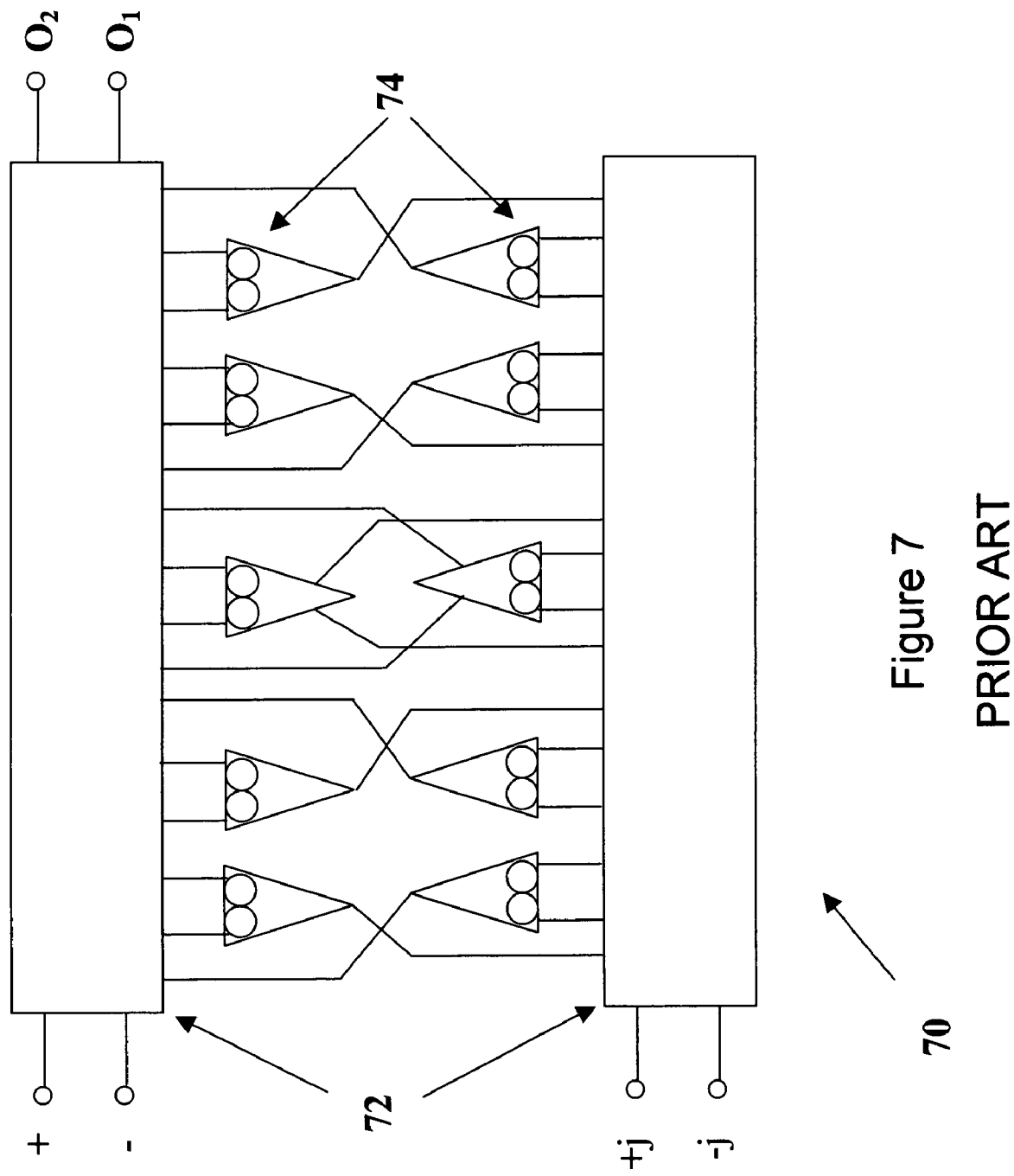
FIG. 7 is a block diagram of a prior art active all-pole complex bandpass ladder filter using active-RC integrators and voltage-controlled current sources.
Figure 8:
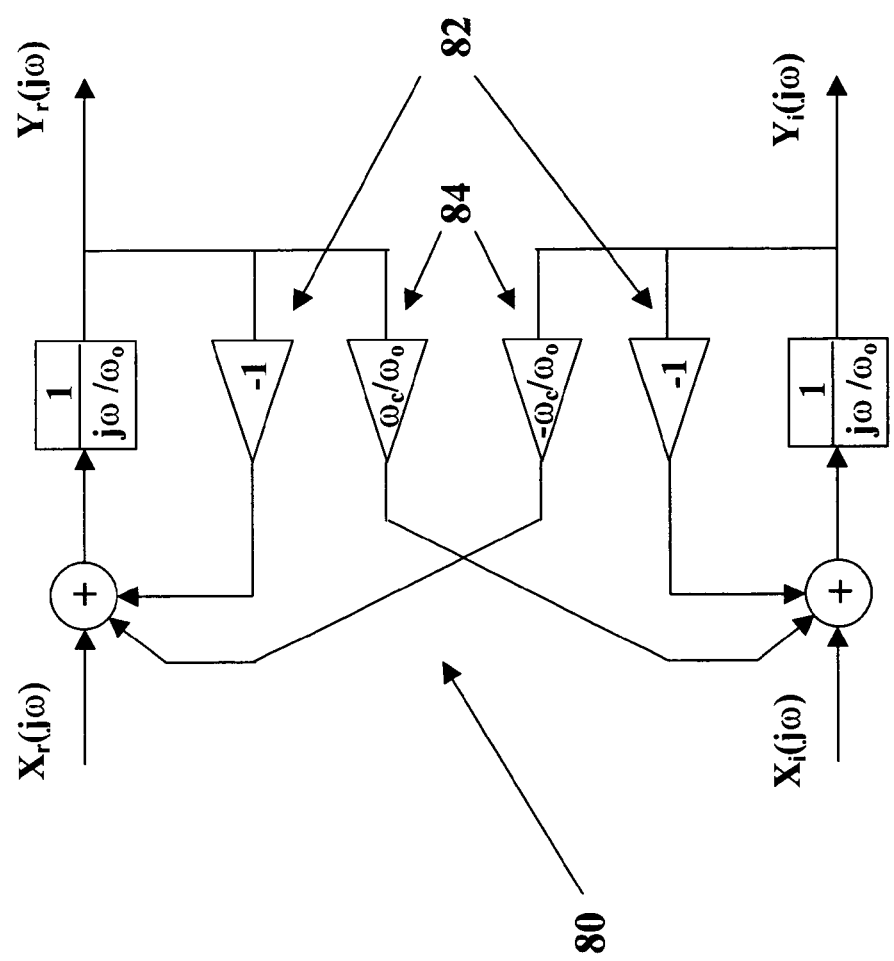
FIG. 8 is a block diagram of a prior art direct complex pole synthesis method.
Figure 9:
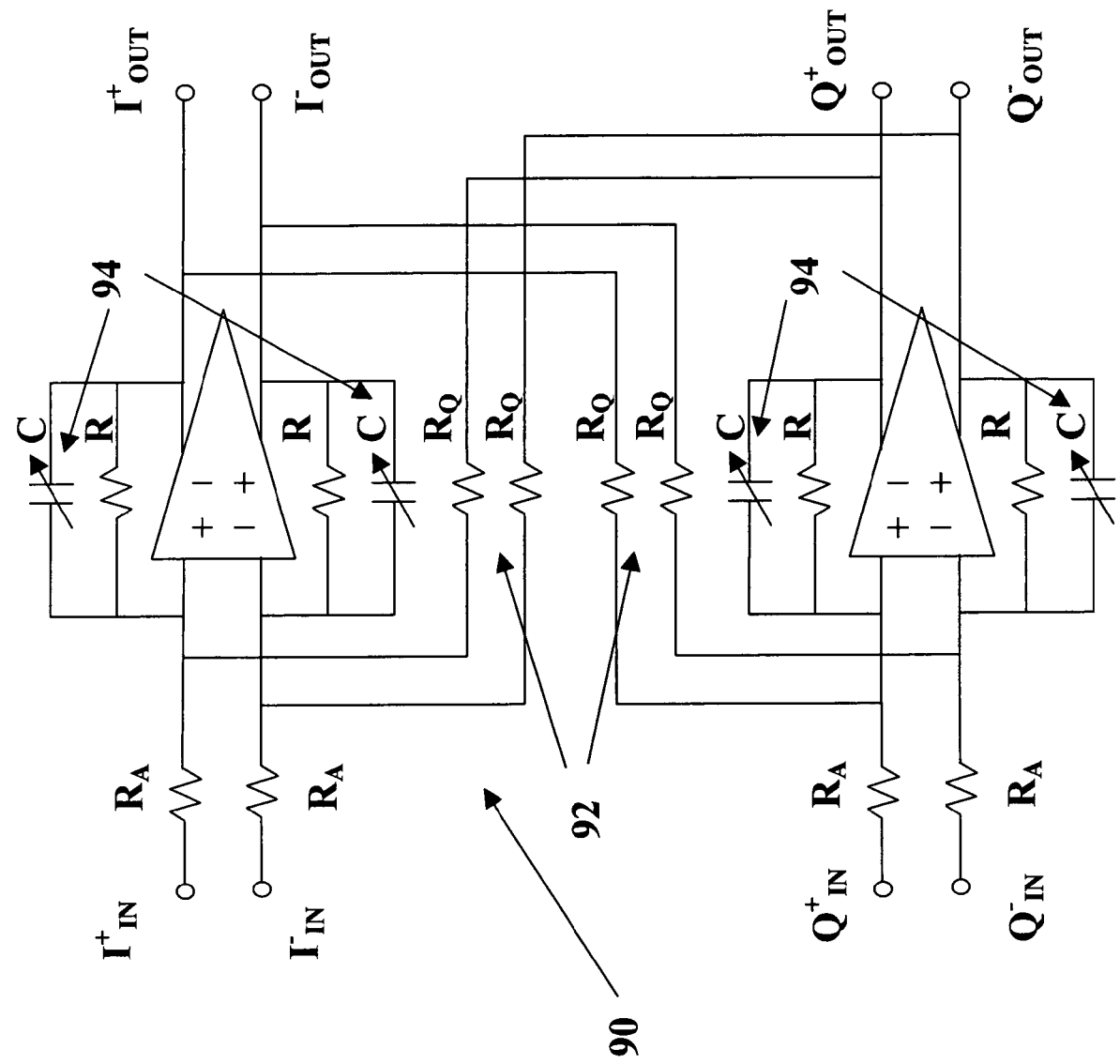
FIG. 9 is a circuit diagram of a prior art the direct complex pole synthesis method using active-RC integrators.
Figure 10:
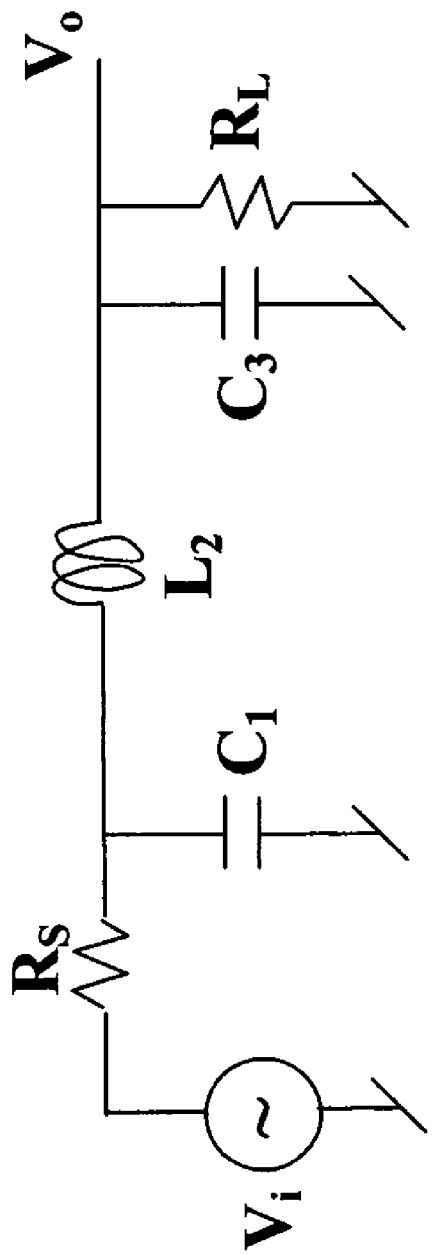
FIG. 10 is a schematic diagram for a third-Order passive LC ladder all-pole lowpass prototype of a prior art ladder synthesis method.
Figure 11:
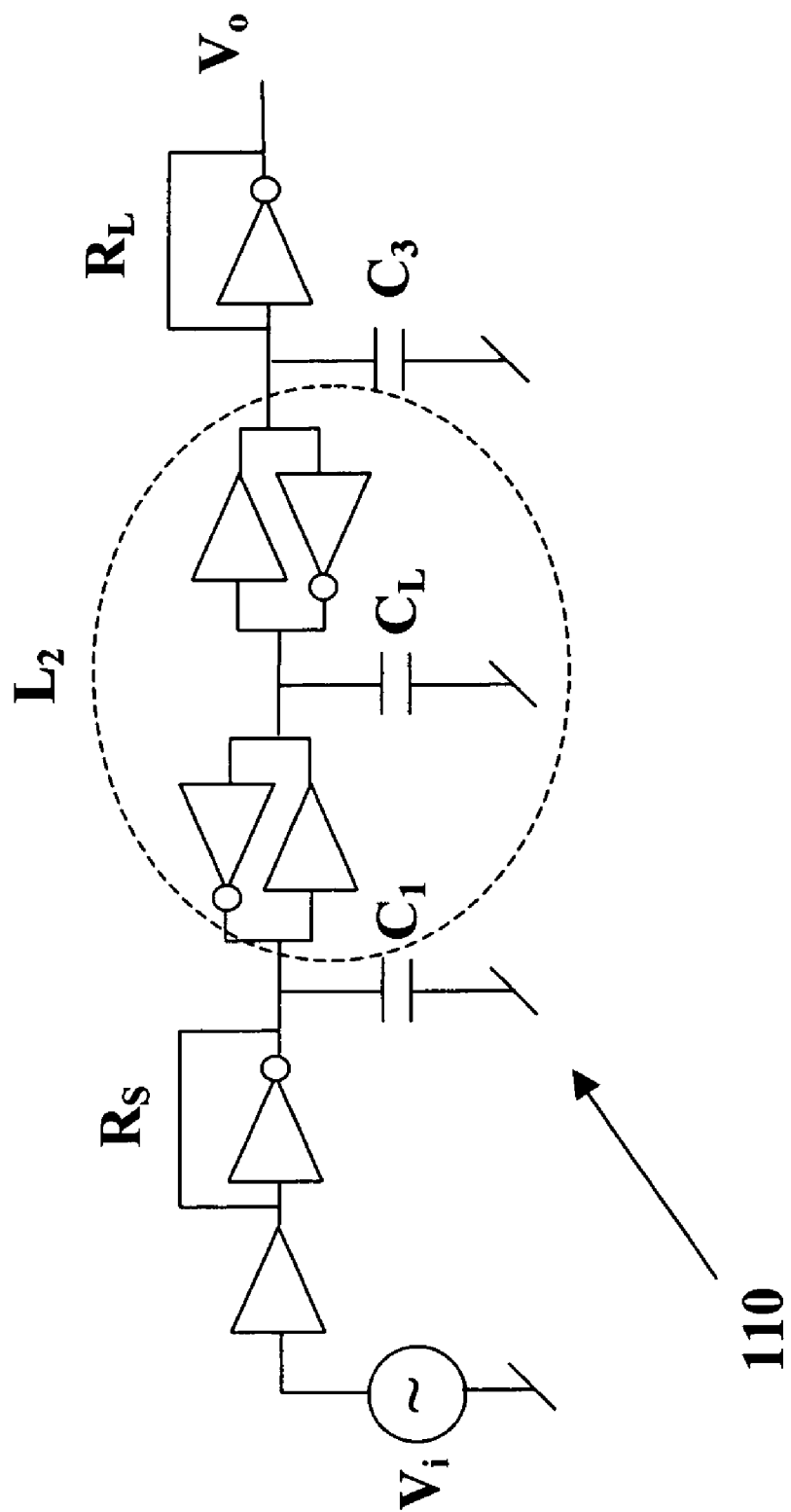
FIG. 11 is a schematic diagram for a third-Order active $g_m$-C ladder all-pole lowpass prototype of a prior art ladder synthesis method.
Figure 12:
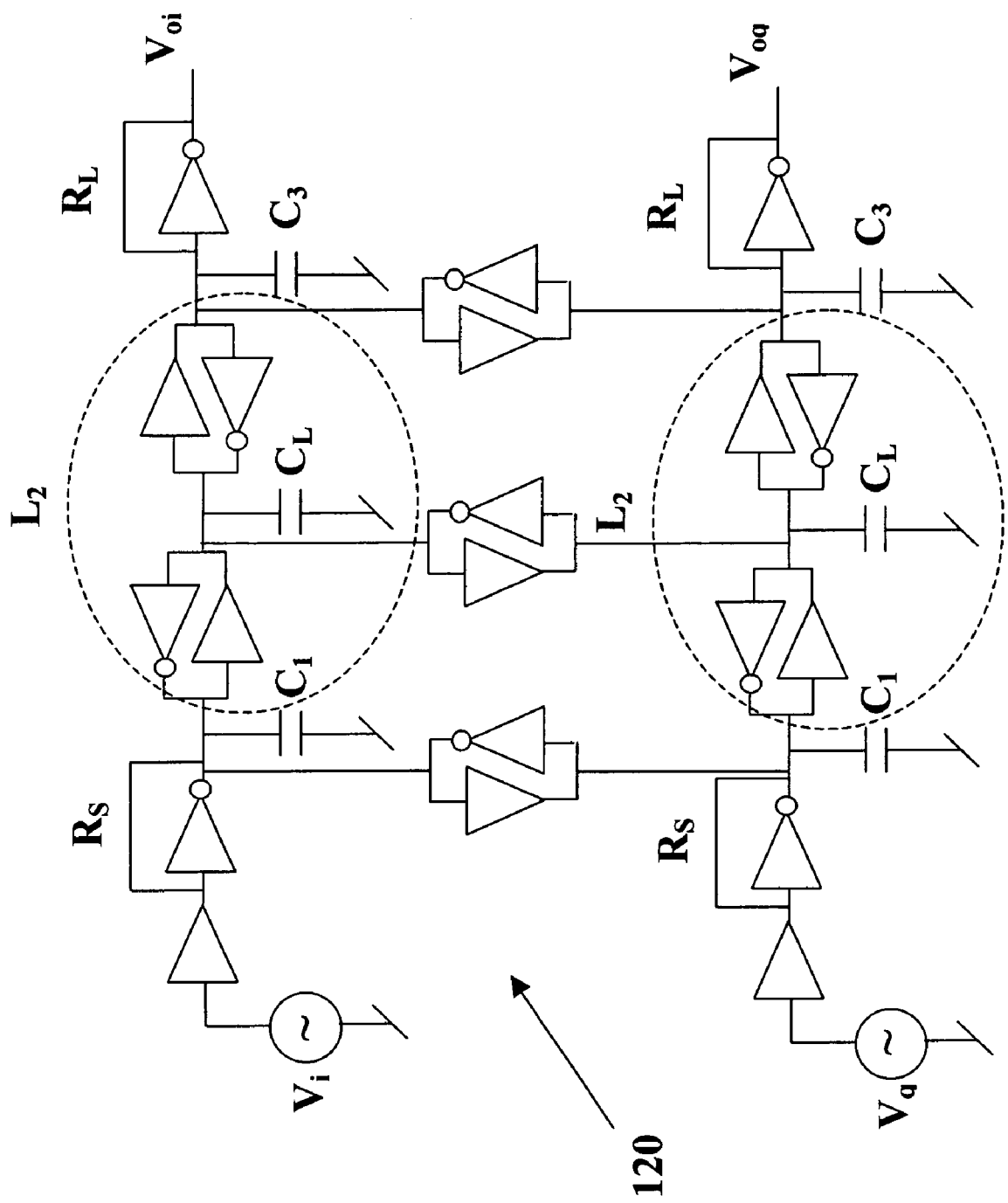
FIG. 12 is a schematic diagram for a sixth-Order active $g_m$-C ladder all-pole complex bandpass filter of a prior art ladder synthesis method.
Figure 13:
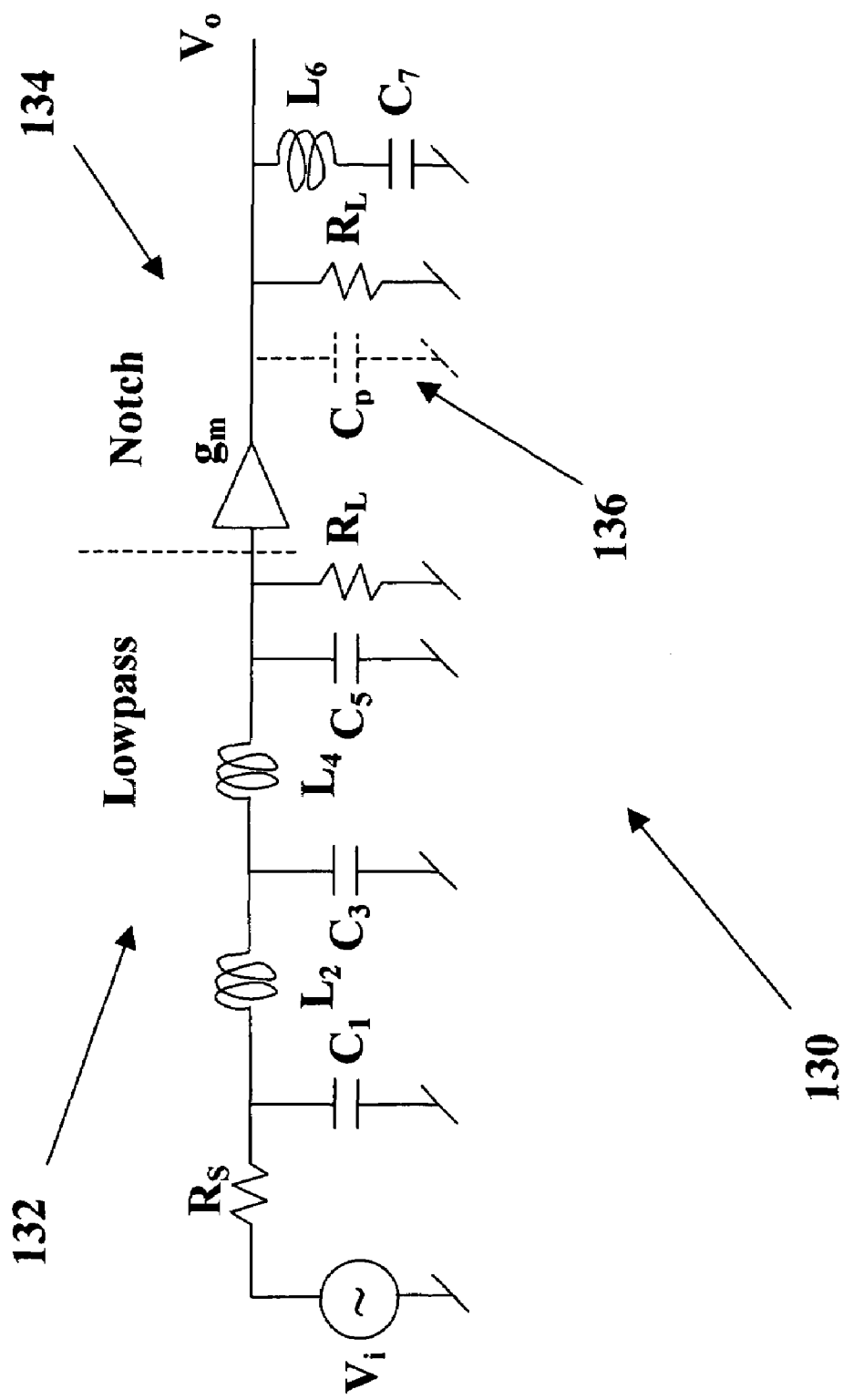
FIG. 13 is a schematic diagram for a fifth-Order passive LC ladder all-pole lowpass prototype combined with a separate notch of a prior art ladder synthesis method.
Figure 14:
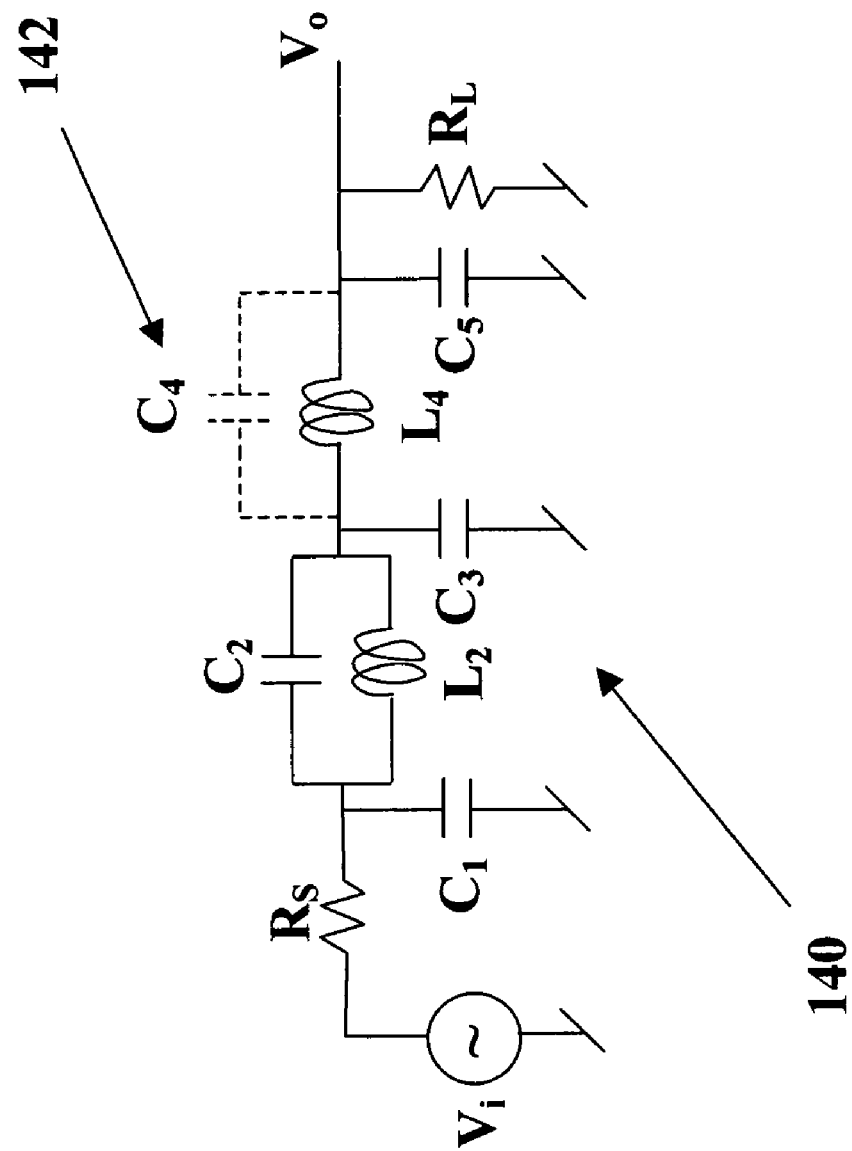
FIG. 14 is a schematic diagram illustrating a method of improving the prior art method by allowing a transmission zero in the ladder lowpass prototype.
Figure 15:
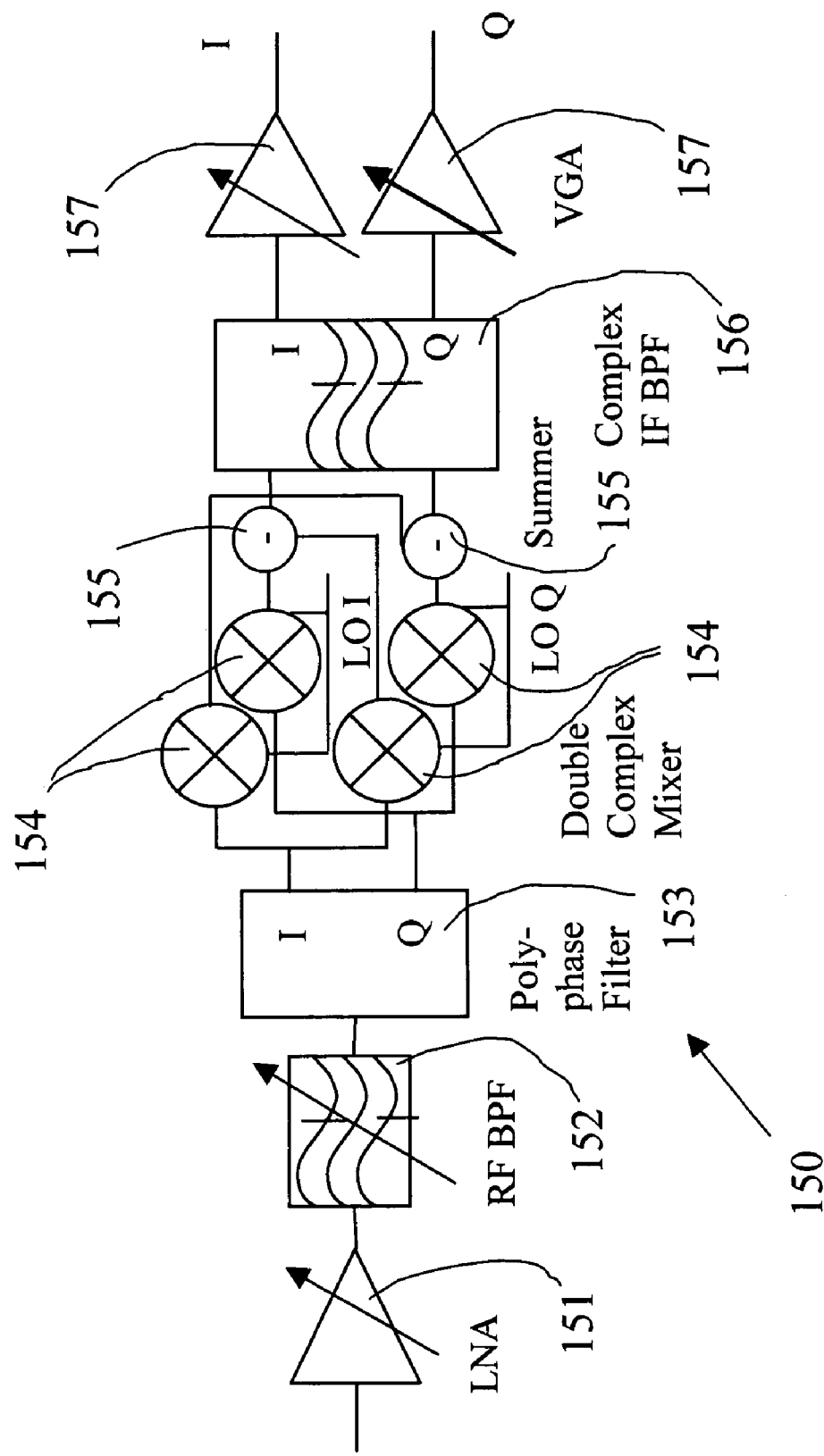
FIG. 15 is the block diagram of a wireless low-IF receiver equipped with the present active complex IF BP filter with transmission zeros.

The present invention is used to implement a fully-integrated continuous-time active complex IF bandpass (BP) filter denoted by numeral 156 in a low-IF wireless receiver identified by numeral 150 in FIG. 15. It consists of a low-noise amplifier (LNA)—151, a tunable RF BP filter—152, a RF polyphase filter—153, a double-complex mixer—154, a pair of summers—155, a complex IF BP filter—156, and a pair of variable gain amplifiers (VGA's)—157. The main function of the complex IF BP filter is IF channel selection and providing the receiver with a substantial image rejection—the task performed jointly with the double-complex mixer and the pair of summers.

Figure 16:
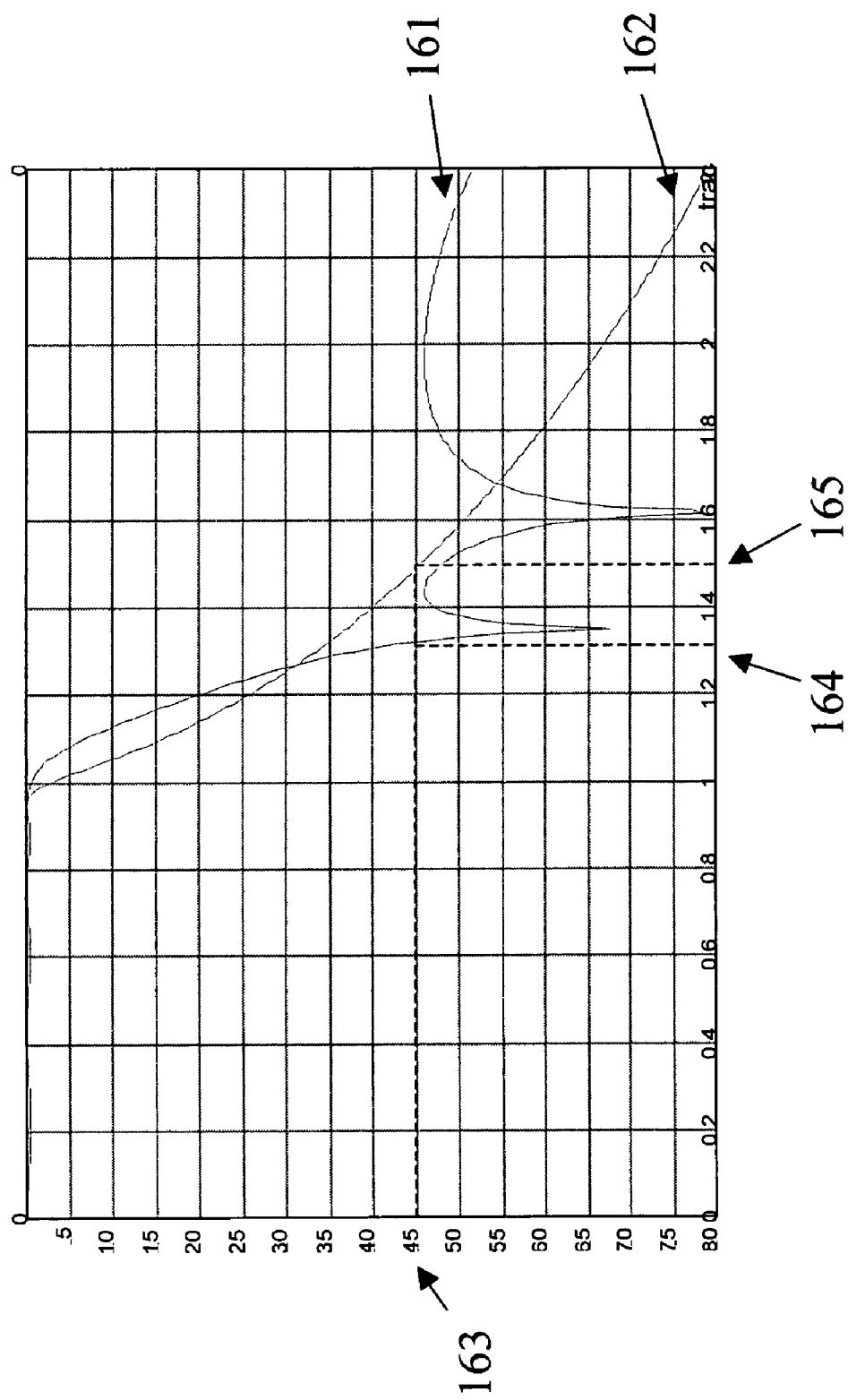
FIG. 16 illustrates the comparison between the attenuation of two LP prototype filters: one with transmission zeros and other—all-pole prototype.

Contrary to other methods the present invention allows to directly incorporate transmission zeros into a complex BP filter transfer function. As illustrated in FIG. 16 for a lowpass (LP) prototype, that yields the filter—161 with much sharper roll-off than that of an all-pole filter—162. The filter with transmission zeros—161 achieve the attenuation of 45 dB, illustrated by numeral 163, at 1.3 times of its cutoff frequency, illustrated by the numeral 164, whereas the all-pole filter requires 1.5 times of its cutoff frequency, illustrated by the numeral 165, to achieve the same attenuation. It should be noted that although the both filters are of seventh-Order they use different approximations. The all-pole filter—162 has much larger passband ripple indicating that its pole Q's are higher that that of the filter—161 with transmission zeros. Since high Q's should be avoided for practical filter implementation—the filter 161 is preferred over the filter—162.

Figure 17:
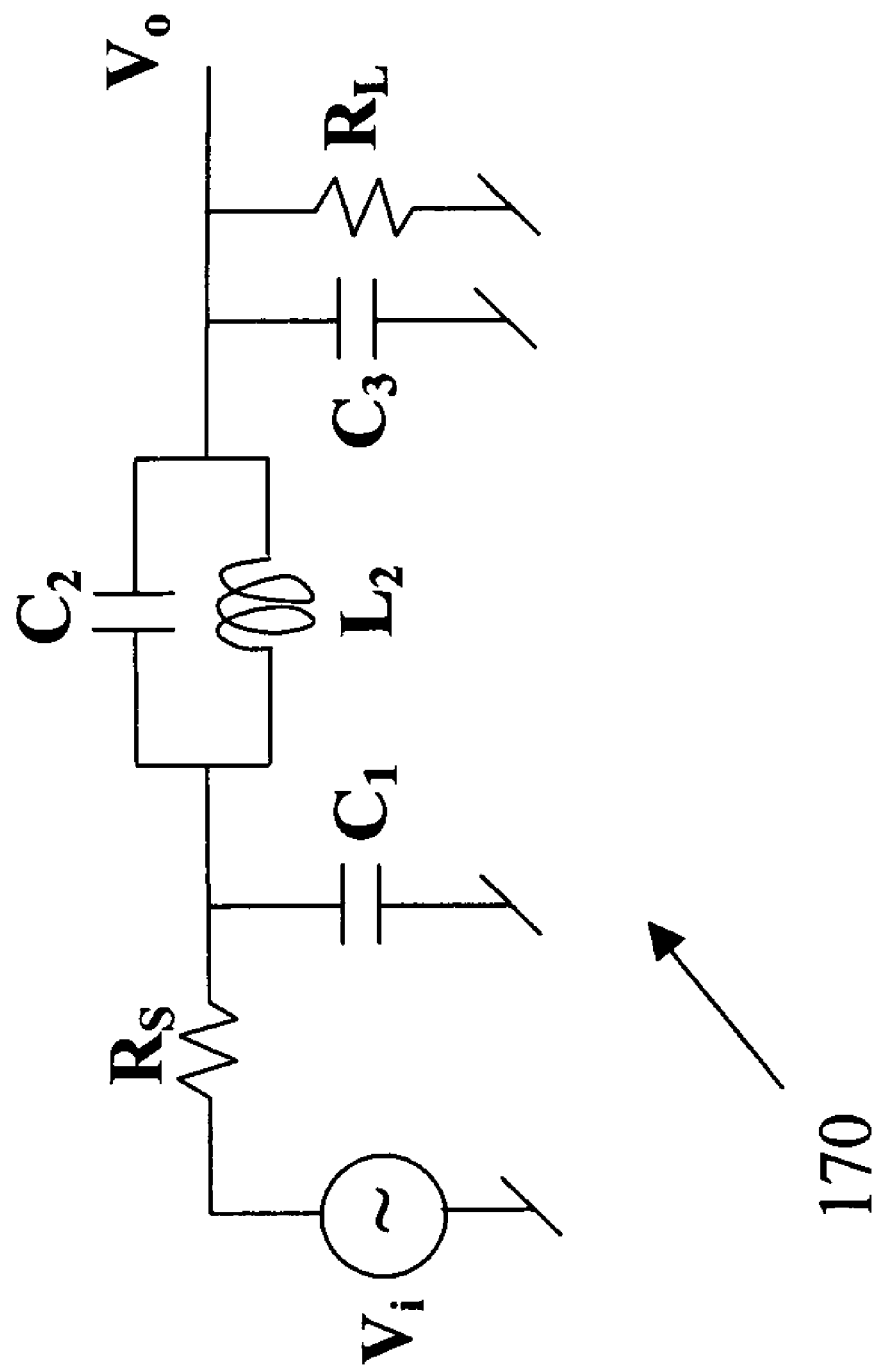
FIG. 17 is a schematic diagram of a passive third-Order lowpass LC ladder prototype with a transmission zero.

Referring to the FIG. 17, a third-Order LP LC-ladder prototype with a transmission zero of the present active complex BP filter with two transmission zeros is illustrated, and is generally identified by the numeral 170. Since it is a lossless LC ladder all its internal components with exception to terminations $R_S$ and $R_L$ are reactances. The transmission zero is generated by the resonance between $L_2$ and $C_2$. Since in an active implementation all inductors are realized with $g_m$-C gyrators, a selected LP prototype uses the fewest number of inductors.

Assuming the termination resistors $R_S=R_L=R_1$ and $C_3=C_1$ the transfer function of the LP prototype 170 can be expressed as $$H_1(s) = \frac{C_2}{R_1 C_1 (C_1 + 2C_2)} \frac{\left(s^2 + \frac{1}{L_2 C_2}\right)}{\left(s + \frac{1}{R_1 C_1}\right)\left(s^2 + s\frac{1}{2R_1(C_1 + 2C_2)} + \frac{2}{L_2(C_1 + 2C_2)}\right)}$$

Figure 18:
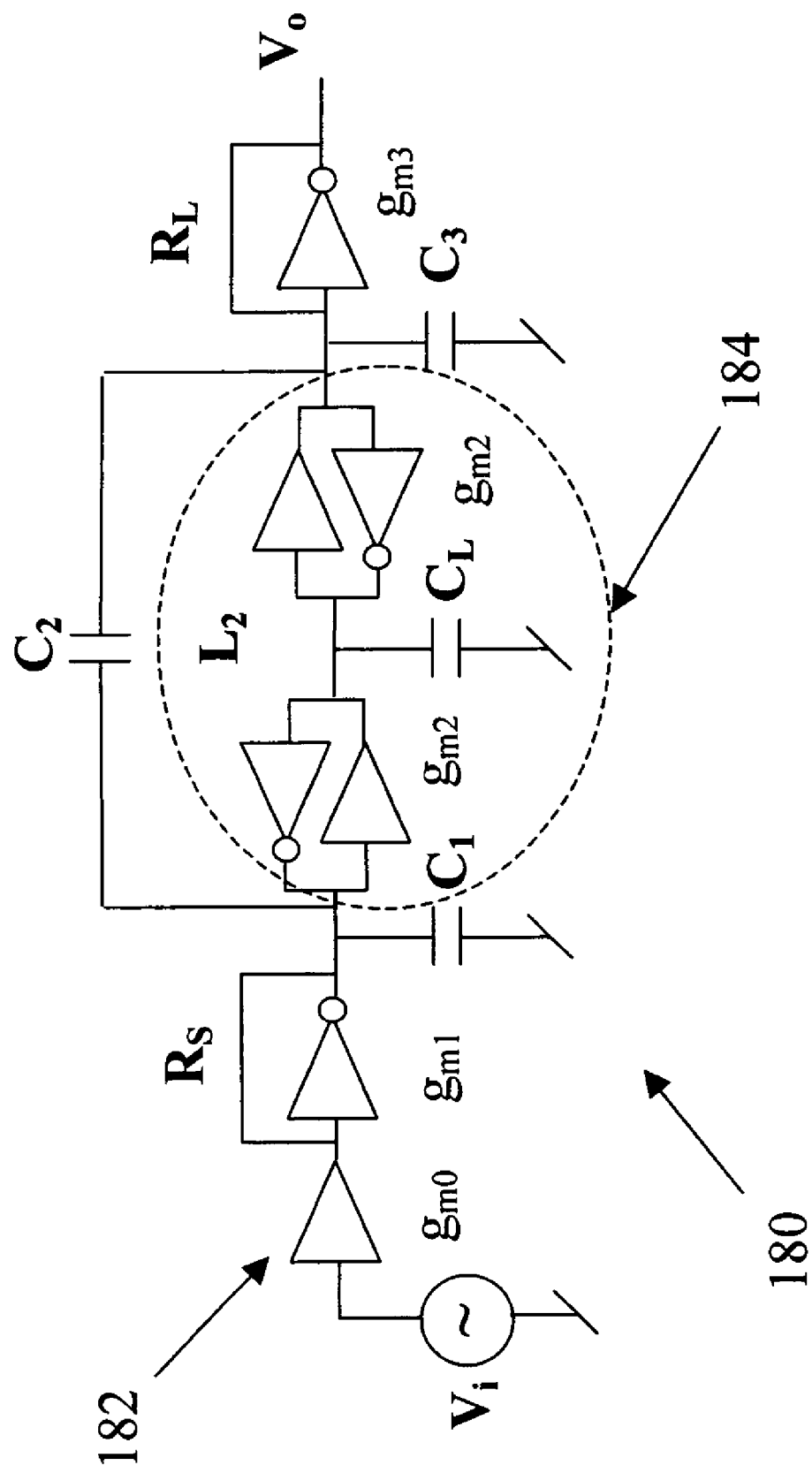
FIG. 18 is a schematic diagram of an active third-Order lowpass $g_m$-C ladder with a transmission zero.

Referring to the FIG. 18, an active realization of third-Order LP LC-ladder prototype with a transmission zero is illustrated, and is generally identified by the numeral 180. The input transconductor—182 serves as a voltage-to-current converter. The termination resistors $R_S$ and $R_L$ are realized as $1/g_m$ resistors. The floating inductor $L_2$—184 is realized with two pairs of gyrators and a grounded capacitor $C_L$. For illustration purpose $L_2$ realization is encircled with a dotted line.

With $R_S=1/g_{m1}$, $R_L=1/g_{m3}$, $C_3=C_1$, $L_2=C_L/g_{m2}^2$, and $g_{m0}$ of the V-I converter the transfer function of the LP prototype—180 can be expressed as $$H_2(s) = A \frac{\left(s^2 + \frac{g_{m2}^2}{C_L C_2}\right)}{\left(s + \frac{g_{m1}}{C_1}\right)\left(s^2 + s\frac{g_{m1}}{2(C_1 + 2C_2)} + \frac{2g_{m2}^2}{C_L(C_1 + 2C_2)}\right)}$$

where $$A = \frac{2g_{m0}}{g_{m1} + g_{m3}} \frac{g_{m1} C_2}{C_1(C_1 + 2C_2)}$$

the center frequency $\omega_o$ and quality factor Q of complex poles are given by $$\omega_o = g_{m2} \sqrt{\frac{2}{C_L(C_1 + 2C_2)}}$$

$$Q = \frac{2g_{m2}}{g_{m1}} \sqrt{\frac{2(C_1 + 2C_2)}{C_L}}$$

and the zero frequency $\omega_z$ is given by $$\omega_z = \frac{g_{m2}}{\sqrt{C_L C_2}}$$

With $g_{m0}=2g_m$ and $g_{m1}=g_{m2}=g_{m3}=g_m$ the transfer function becomes $$H_3(s) = \frac{\frac{2g_m C_2}{C_1(C_1 + 2C_2)}\left(s^2 + \frac{g_m^2}{C_L C_2}\right)}{\left(s + \frac{g_m}{C_1}\right)\left(s^2 + s\frac{g_m}{2(C_1 + 2C_2)} + \frac{2g_m^2}{C_L(C_1 + 2C_2)}\right)}$$

Note that with $s \to 0$ $H_3(s) \to 1$, which is expected for a LP transfer function.

Figure 19:
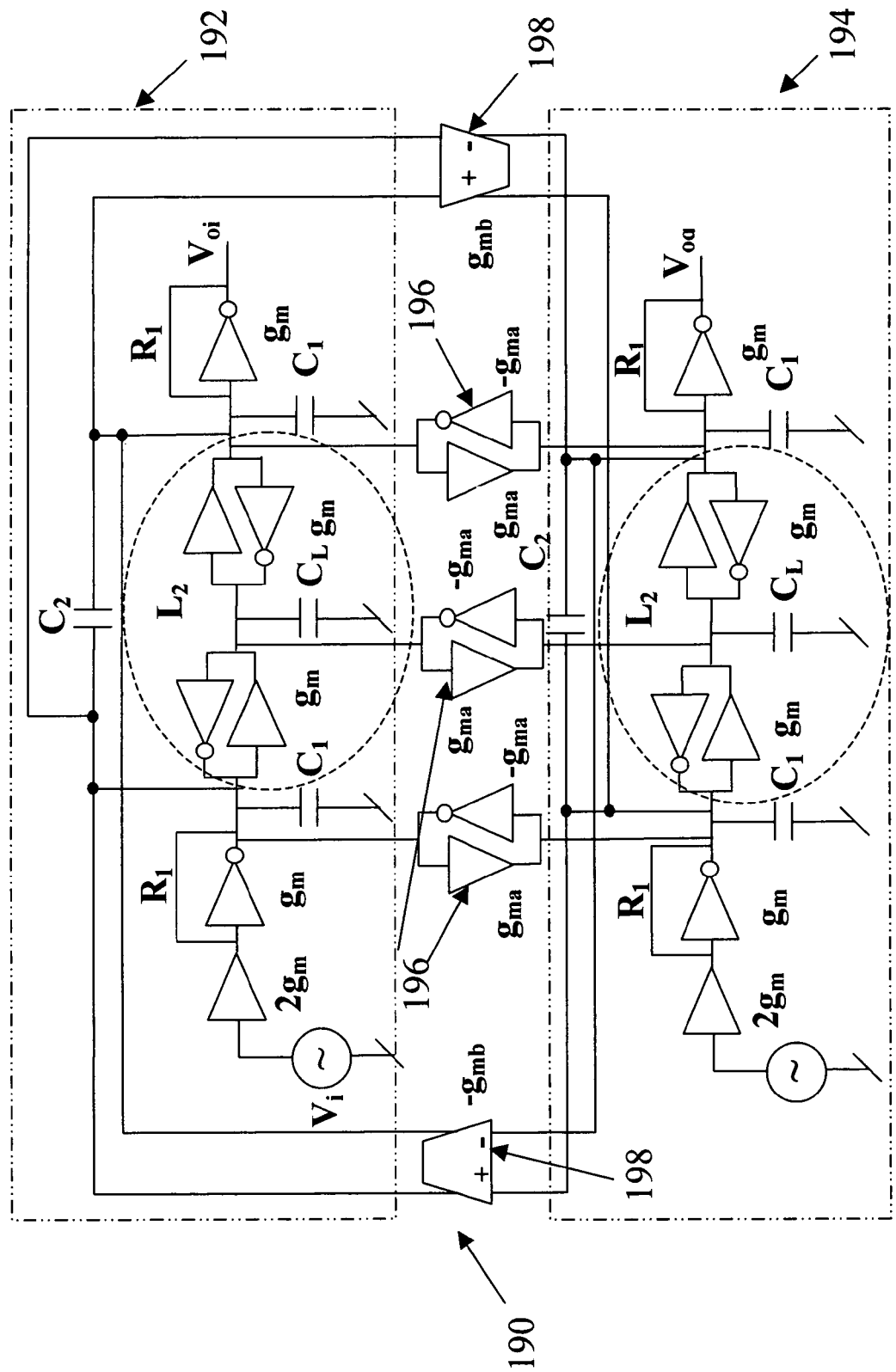
FIG. 19 is a schematic diagram of an active sixth-Order complex bandpass $g_m$-C ladder with two transmission zeros.

Referring to the FIG. 19, an active realization of a sixth-Order complex BP with two transmission zeros is illustrated, and is generally identified by the numeral 190. It consists of two identical LP I and Q filters identified by the numerals 192 and 194 respectively and fed with shifted by 90 degrees I and Q inputs. In complex notation if I input is $V_I$ then Q input becomes $jV_I$. Two types of shifting transconductors are used in the filter—190. For each of the three pairs of grounded capacitors $C_1$ and $C_L$ of the two filters—192 and 194 a pair of single-ended transconductors—196 with opposite polarities $-g_{ma}$ and $g_{ma}$ is applied and for the pair of zero generating floating capacitors $C_2$ a pair of differential transconductors—198 with opposite polarities $-g_{mb}$ and $g_{mb}$ is used.

As illustrated in FIG. 20 the effect of a transconductor—196 in FIG. 19 on a grounded capacitor $C_1$ is shifting its frequency response by the vector $j\omega_c=jg_{ma}/C_1$. The explanation of this property is as follows: without the transconductor $g_{ma}$ the current through $C_1$ is $I=j\omega C_1 V$. By adding the current of $g_{ma}$ the total current through $C_1$ becomes $I^*=j(\omega C_1-g_{ma})V$. Hence, the admittance of $C_1$ without $g_{ma}$ is $Y=j\omega C_1$, and with $g_{ma}$ is $Y^*=j(\omega C_1-g_{ma})=jC_1(\omega-g_{ma}/C_1)=jC_1(\omega-\omega_c)$, where $\omega_c=g_{ma}/C_1$. If the filter contained several different values of grounded capacitors the $g_{ma}$'s should be adjusted for each capacitor such that $\omega_c$ was always constant. It should be noted that although the shifting transconductors—196 in FIG. 19 are presented as single-ended if I and Q signals are differential the whole filter structure becomes differential meaning that the transconductors—196 need to become also differential.

Figure 21:
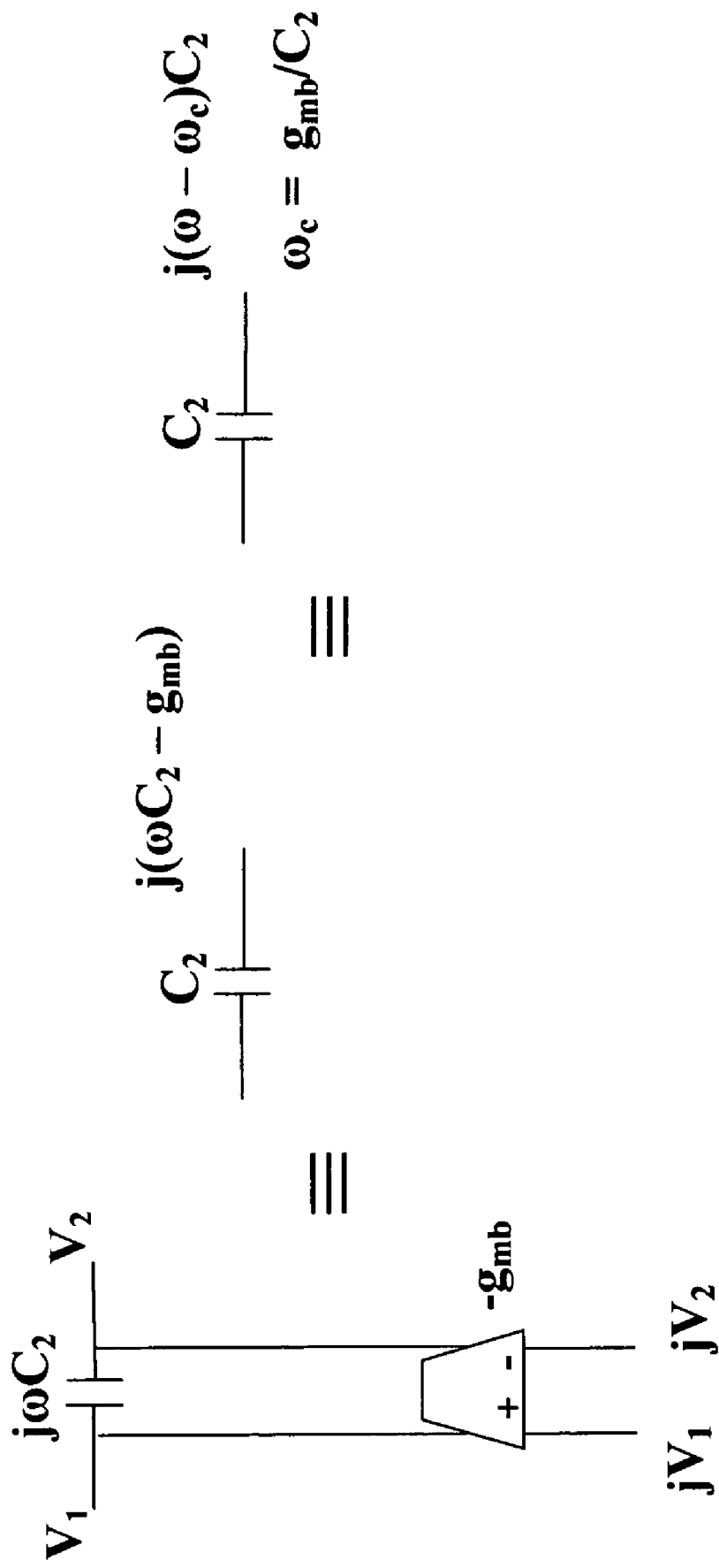
FIG. 21 is a schematic diagram of a floating C with a differential shifting transconductor illustrating the idea of complex shifting of a floating C.

As illustrated in FIG. 21 the effect of transconductors—198 in FIG. 19 on floating capacitor $C_2$ is shifting its frequency response by the vector $j\omega_c=jg_{mb}/C_2$. Again, the explanation of this property is as follows: without the transconductor $g_{mb}$ the current through $C_2$ is $I=j\omega C_2(V_1-V_2)$. By adding the current of $g_{mb}$ the total current through $C_2$ becomes $I^*=j(\omega C_2-g_{mb})(V_1-V_2)$. Hence, the admittance of $C_2$ without $g_{mb}$ is $Y=j\omega C_2$, and with $g_{mb}$ is $Y=j(\omega C_2-g_{mb})=jC_2(\omega-g_{mb}/C_2)=jC_2(\omega-\omega_c)$, where $\omega_c=g_{mb}/C_2$. If the filter contained several different values of floating capacitors the $g_{mb}$'s should be adjusted for each capacitor such that $\omega_c$ was always constant. It should be noted that although the shifting transconductors—198 in FIG. 19 are presented as differential if I and Q signals are also differential the whole filter structure becomes differential meaning that the transconductors—198 need to become double-differential at the input and output.

Figure 22:
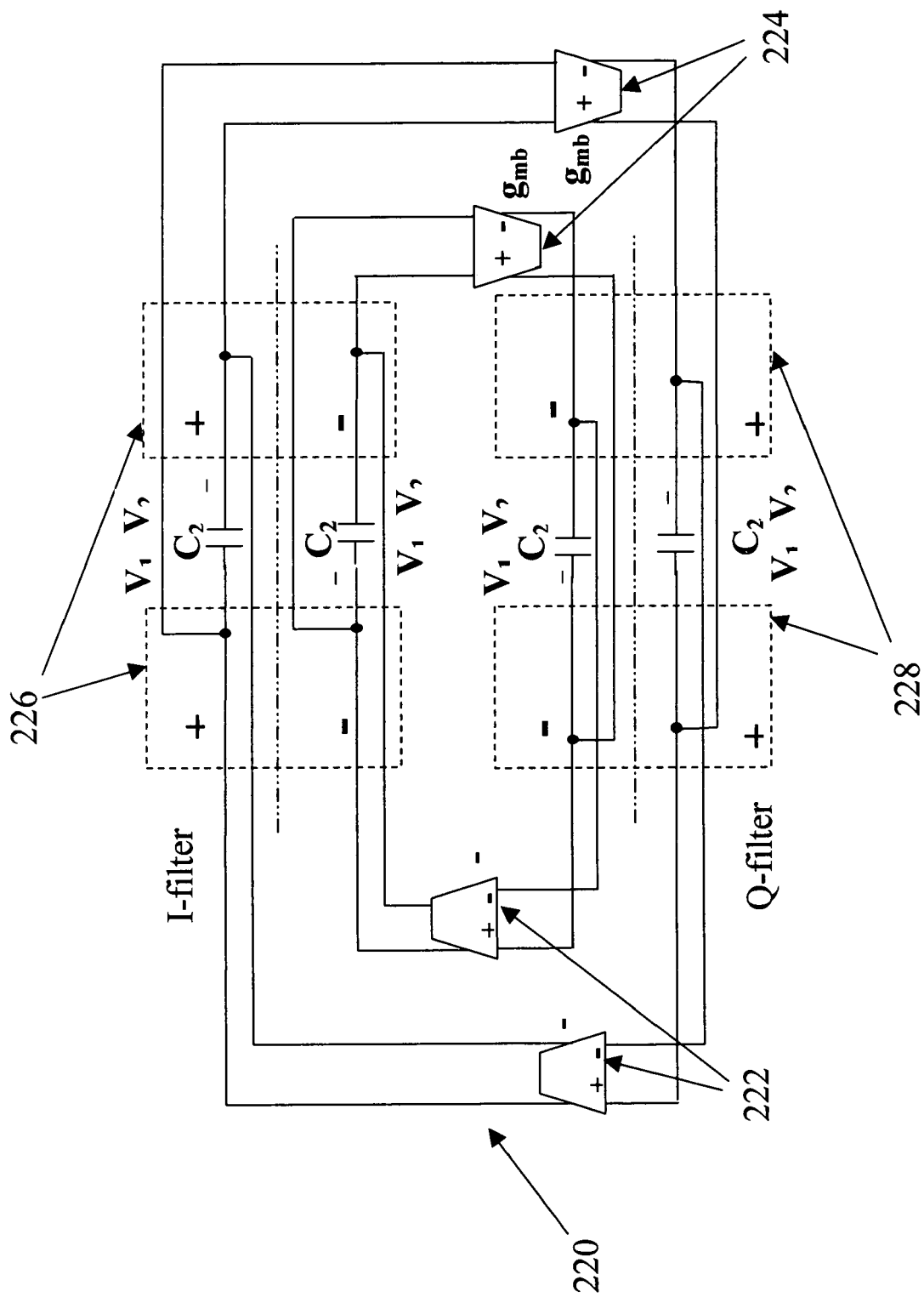
FIG. 22 is a schematic diagram of differential shifting transconductors for transmission-zero-generating differential series C's.

As illustrated in FIG. 22, and generally identified by the numeral 220, the simplest way to realize the transconductors—198 in FIG. 19 is to use two separate differential transconductors $-g_{mb}$—222 and $g_{mb}$—224 for each pair of differential voltages $(V_1-V_2)^+$ and $(V_1-V_2)^-$ between I-filter—226 and Q-filter—228. These double differential transconductors—222 and 224 are one of the main features of the present invention that allows building practical active tunable complex bandpass filters with transmission zeros.

Figure 23:
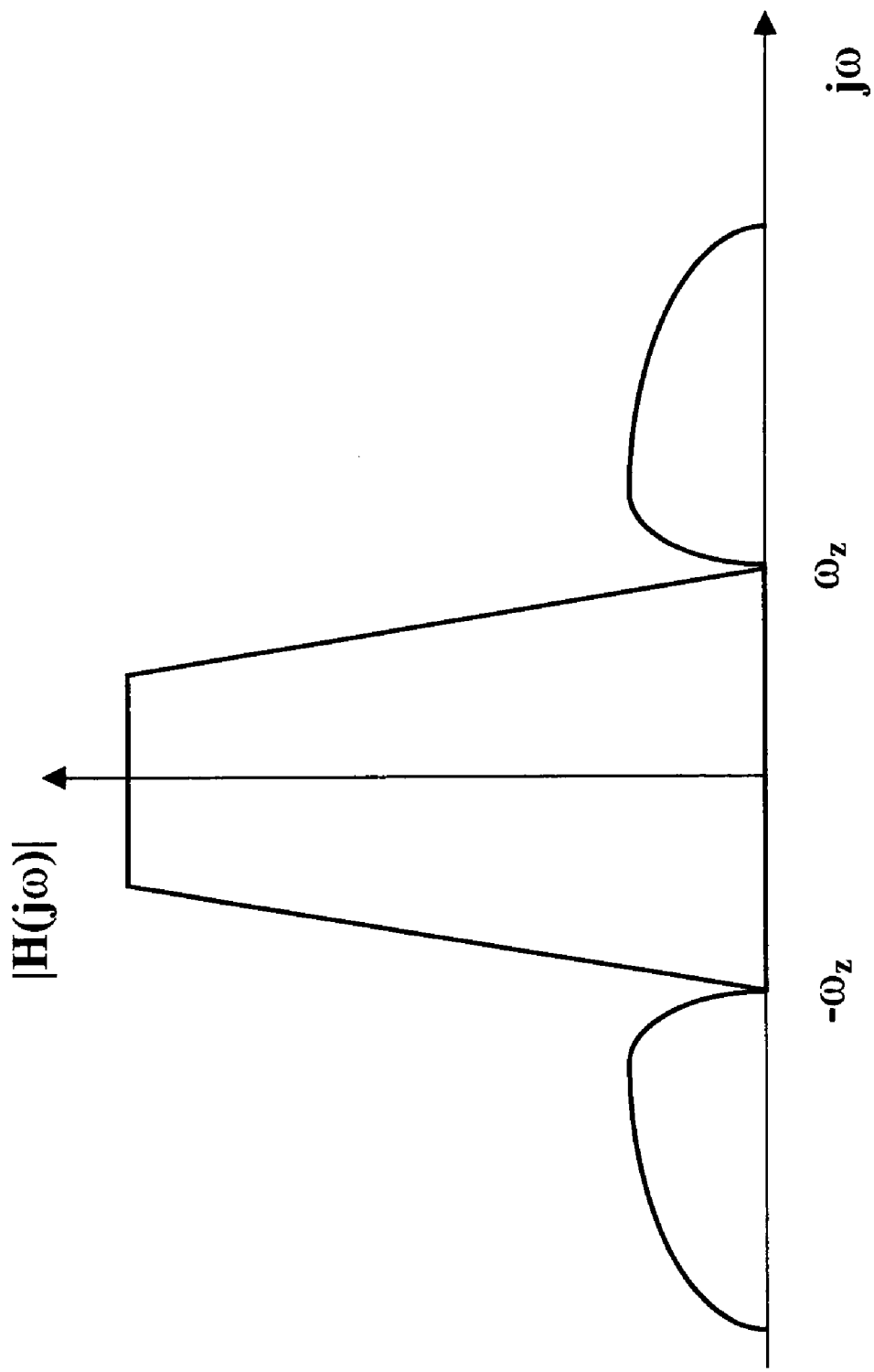
FIG. 23 is an illustration of a real lowpass transfer function with a transmission zero.
Figure 24:
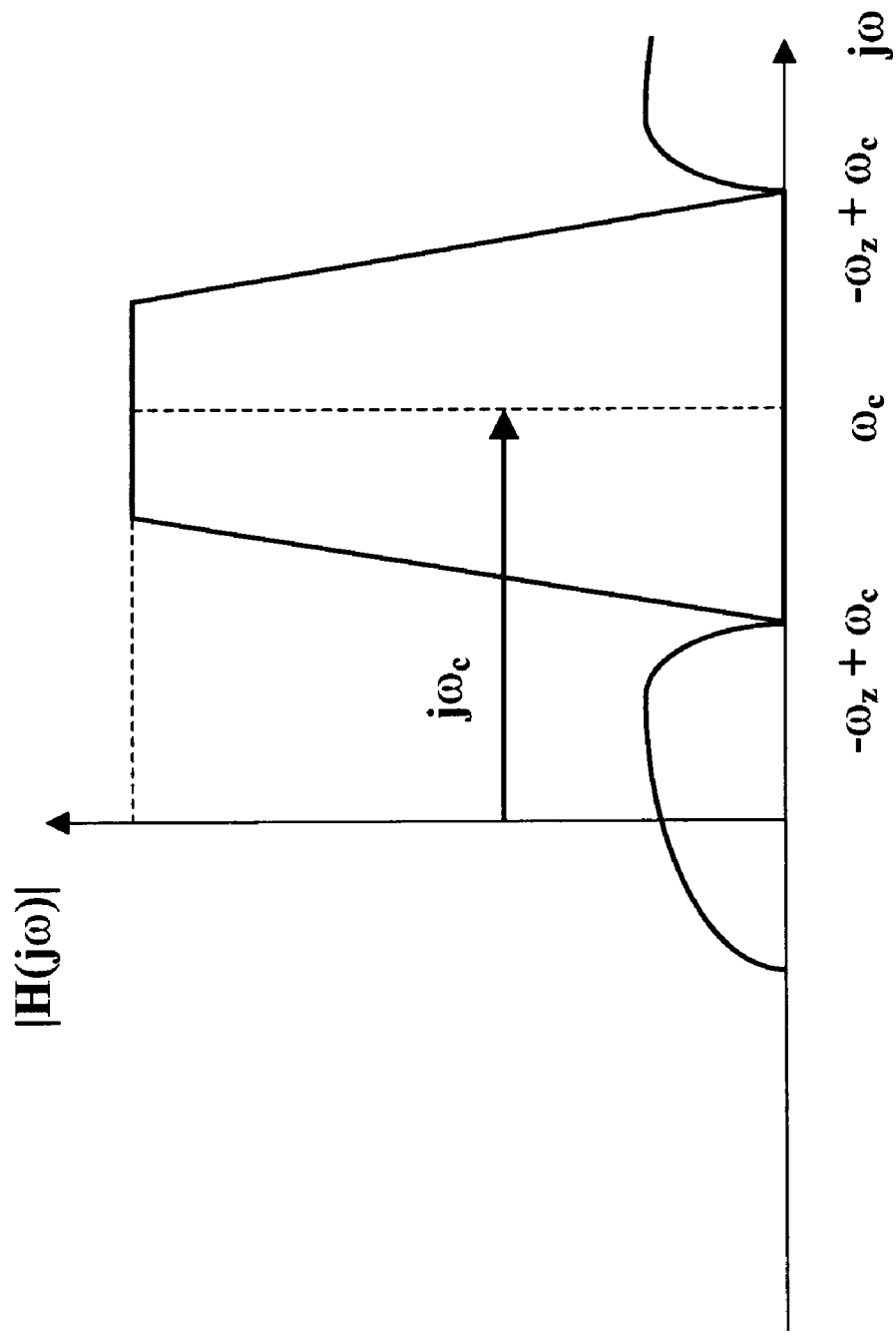
FIG. 24 is an illustration of a lowpass transfer function with a transmission zero shifted by a vector $j\omega_c$ that becomes a complex bandpass transfer function with two transmission zeros.

Referring to the FIG. 23, the transfer function of a real LP prototype with transmission zeros in FIG. 18 is illustrated. The two transmission zeros are symmetrical at $\pm j\omega_z$. As illustrated in FIG. 24 after applying the shifting as explained in FIGS. 20 and 21 the transfer function of the present complex BP filter in FIG. 19 is moved by vector $j\omega_c$. The two transmission zeros are now positioned at $j(\omega_c \pm j\omega_z)$.

Figure 25:
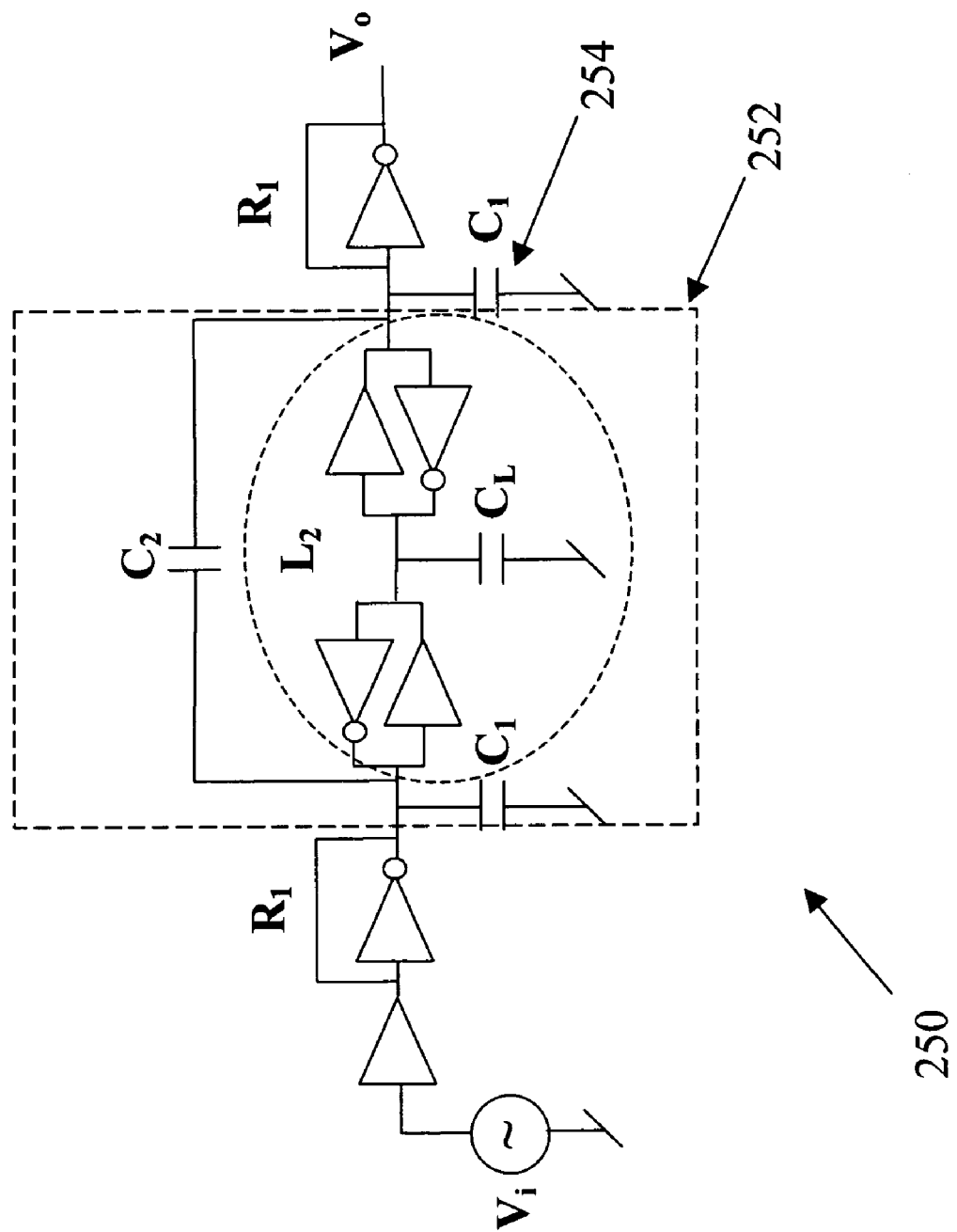
FIG. 25 is a schematic diagram of an active third-Order lowpass $g_m$-C ladder with a transmission zero built with a C-LC section.

Referring to the FIG. 25, an active realization of a third-Order LP prototype filter with a transmission zero is illustrated, and is generally identified by the numeral 250. It contains a shunt C—series LC section identified by the numeral 252 and marked with a dotted line. By repeating this section a higher order LP filters with transmission zeros can be implemented. Since the filter is of third-Order its last section—$C_1$ is formed by a shunt C—254.

Figure 26:
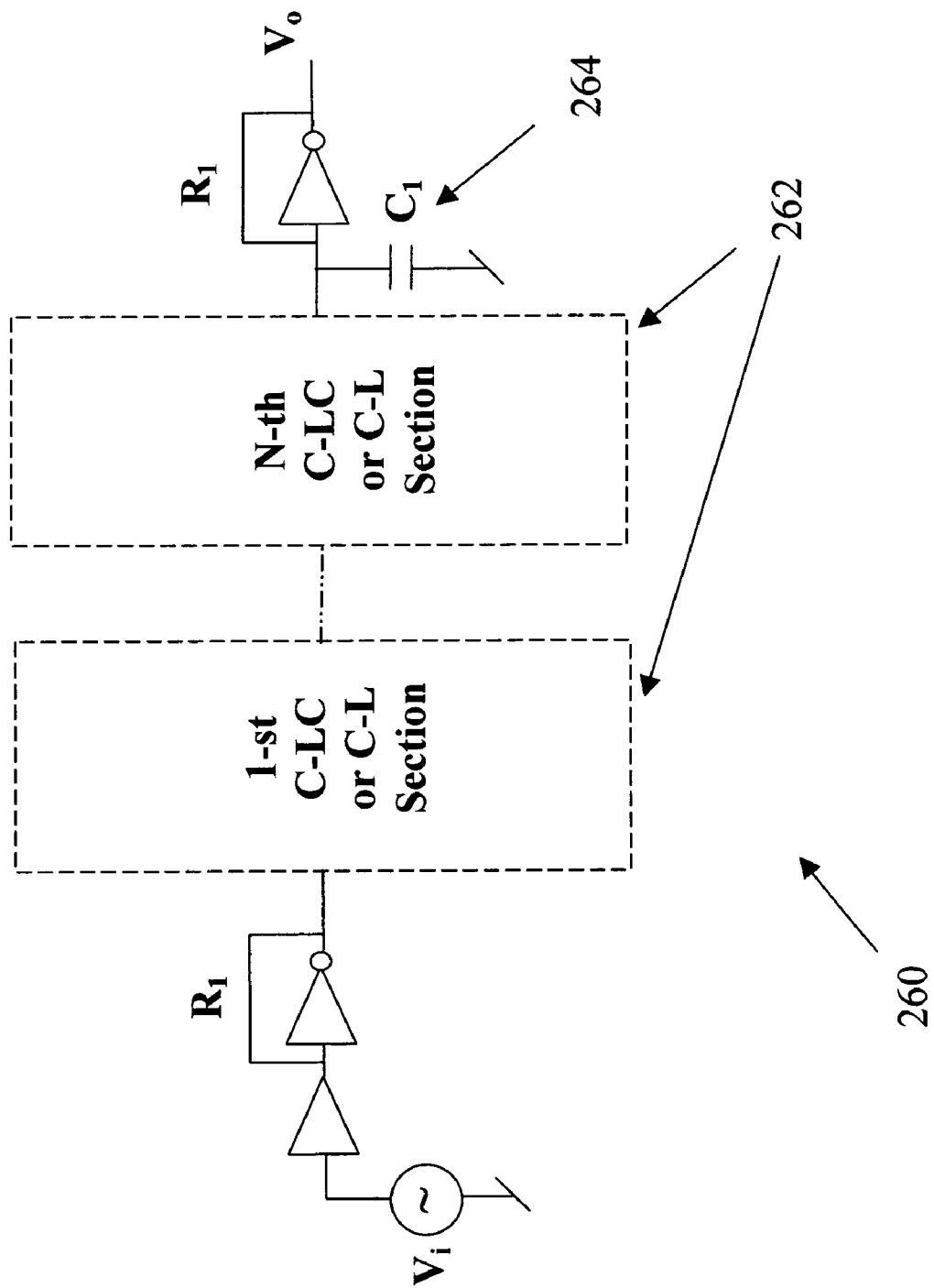
FIG. 26 is a schematic diagram of an active (2N+1) th-Order lowpass $g_m$-C ladder with up to N transmission zeros built with N separate C-LC, or C-L sections and a shunt C section.

Referring to the FIG. 26, an active realization of a (2N+1) th-Order LP prototype filter with up to N transmission zeros is illustrated, and is generally identified by the numeral 260. Without of loosing generality, it may contain N shunt C—series LC, or shunt C—series L sections identified by the numerals 262. The shunt C—series L sections are simply sections without transmission zero. Since the filter—260 is of an odd-Order its last section—$C_1$ is formed by a shunt C—264.

Figure 27:
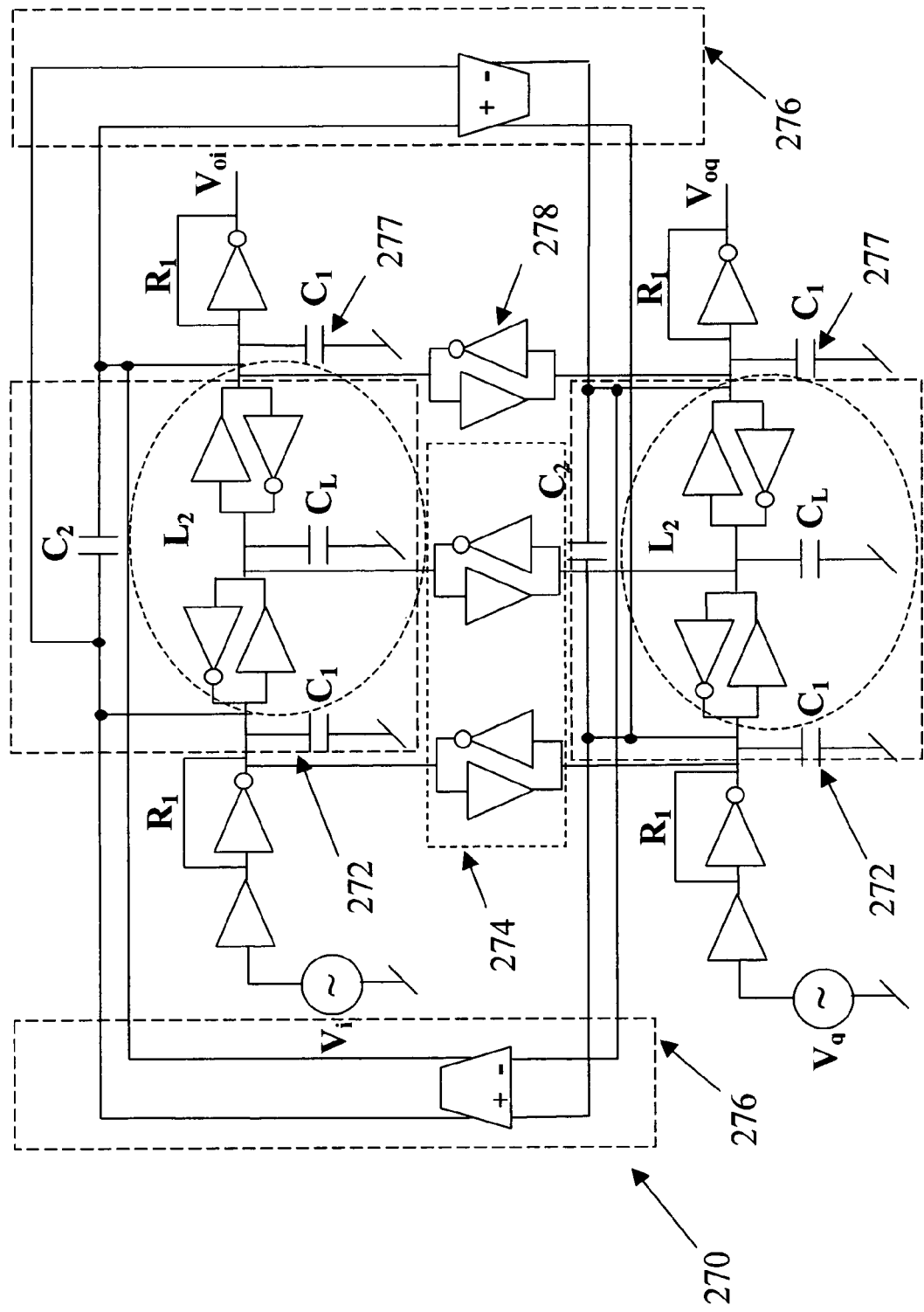
FIG. 27 is a schematic diagram of an active sixth-Order complex bandpass $g_m$-C ladder with two transmission zeros built with a double C-LC section including shifting transconductors.

Referring to the FIG. 27, an active realization of a sixth-Order complex BP filter with two transmission zeros is illustrated, and is generally identified by the numeral 270. It consists of two third-Order LP filters—250 of FIG. 25 with I, Q inputs and outputs and shifting circuitry connected between them. The filter—270 contains two shunt C—series LC sections identified by the numerals 272, a grounded C shifting circuit—274 consisting of two pairs of single-ended transconductors: first to shift the actual shunt C and second to shift the grounded C of the active series inductor, and a series C shifting circuit—276 consisting of a pair of differential transconductors. Sections 272, 274 and 276 form together a double C-LC section with shift and are marked with dotted lines. By repeating this section a higher order BP filters with transmission zeros can be implemented. Since the LP prototype—250 in FIG. 25 is of a third-Order the filter last section—a double shunt C-section with shift is formed by a pair of shunt C's—277 together with a pair of single-ended shifting transconductors—278.

Figure 28:
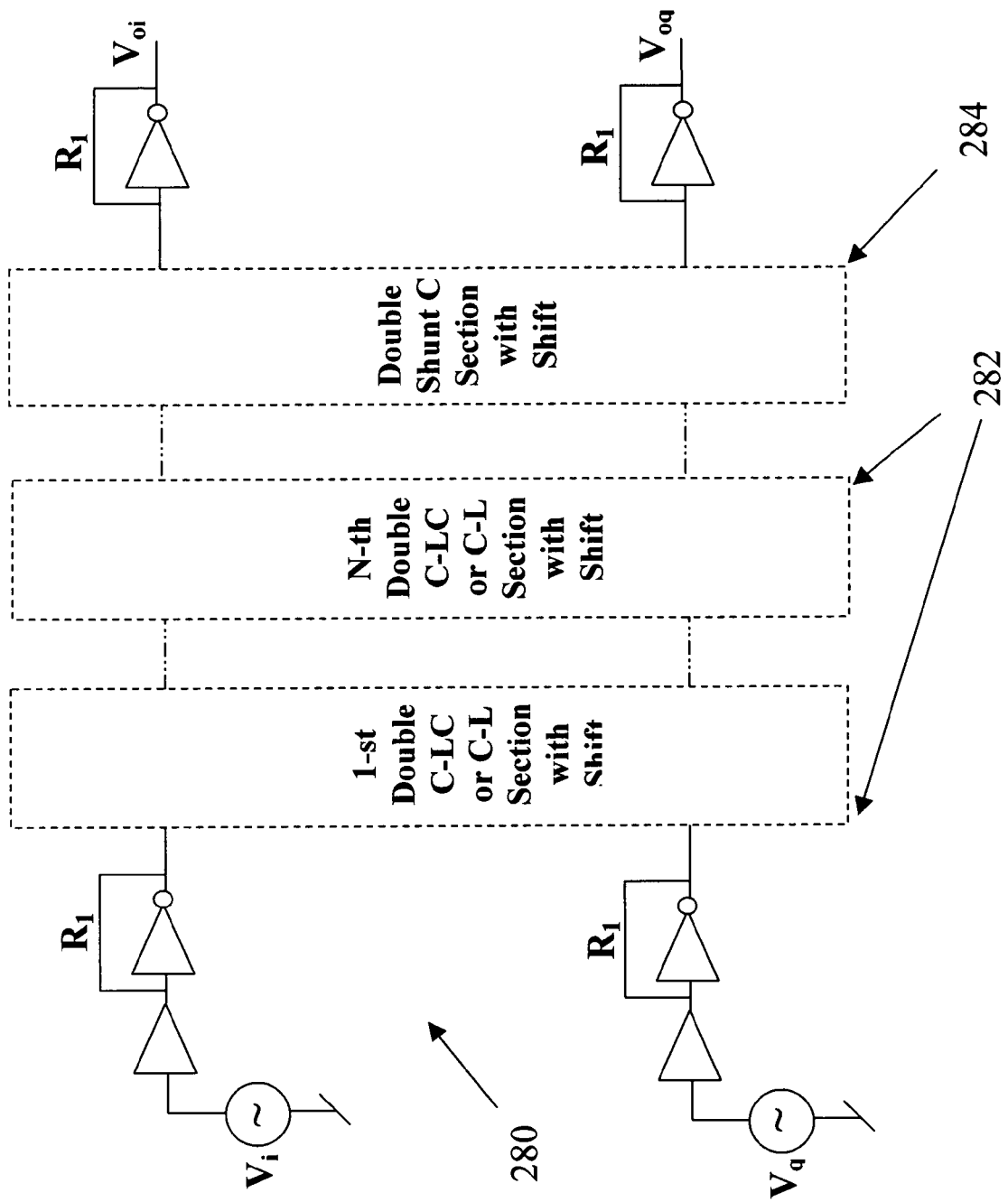
FIG. 28 is a schematic diagram of an active 2*(2N+1) th-Order complex bandpass $g_m$-C ladder with up to 2N transmission zeros built with N separate double C-LC, or C-L sections including shifting transconductors and a double shunt C section with shift.

Referring to the FIG. 28, an active realization of a 2*(2N+1) th-Order BP filter with up to 2N transmission zeros is illustrated, and is generally identified by the numeral 280. Without of loosing generality, it may contain N double shunt C—series LC, or shunt C—series L sections all equipped with shift circuits and identified by the numeral 282. The double shunt C—series L sections are simply sections without transmission zeros. Each time the series C is omitted the associated shifting circuit—276 in FIG. 27 is also dropped. The last filter section is a double shunt C-section with shift identified by the numeral 284.

Other features that are considered as characteristic for the invention are set forth in the appended claims.

Although the invention is illustrated and described herein as embodied in a circuit configuration for fully-integrated continuous-time active complex band-pass filters with transmission zeros built with transconductance amplifiers and capacitors, it is, nevertheless, not intended to be limited to the details shown because various modifications and structural changes may be made therein without departing from the spirit of the invention and within the scope and range of equivalents of the claims.

I claim:

1. A continuous-time active complex bandpass ladder filter with transmission zeros comprising:
   a ladder filter having a transfer function having poles and imaginary transmission zeros and generated using only a plurality of filter elements including transconductors, $g_m$, capacitors, C, and inductors, L, L being implemented as $g_m$—C gyrators, wherein the poles and transmission zeros of the filter are solely defined by all the $g_m$ and C filter elements in the ladder filter, and including:
   I input and 90-degree phase shifted Q input:
   I output and 90-degree phase shifted Q output:
   each input of the I input and the Q input coupled to an input $g_m$-cell voltage-to-current converter:
   an input $1/g_m$ source resistor connected to the converter; and
   an input $1/g_m$ load resistor connected to one of the I output and the Q output the ladder filter output, such that the transfer function forms an unsymmetrical complex bandpass transfer function that transmits signals for positive frequencies and blocks signals for negative frequencies or transmits signals for negative frequencies and blocks signals for positive frequencies.

2. The continuous-time complex bandpass ladder filter with transmission zeros of claim 1 wherein said ladder filter is an on-chip device.

3. The continuous-time active complex bandpass ladder filter with transmission zeros of claim 2 wherein said ladder filter is fabricated in monolithic technology selected from the group consisting of silicon CMOS, BiCMOS and bipolar processes or a non-silicon process.

4. The continuous-time active complex bandpass ladder filter with transmission zeros of claim 3 wherein said ladder filter is single-ended.

5. The continuous-time active complex bandpass ladder filter with transmission zeros of claim 4 and further including at least one set consisting of:
   two shunt C series L circuits connected to the source resistor: first fed with a single-ended I signal and second fed with a single-ended Q signal shifted 90 degrees with respect to I;
   and two pairs of single-ended transconductors connected to the source resistor.

6. The continuous-time active complex bandpass ladder filter with transmission zeros of claim 5 wherein:
   the said first transconductor of first pair with the value of $-g_{ma}$ has the input at the shunt C of the Q C-L circuit and the output at the shunt C of the said I C-L circuit;
   the said first transconductor of second pair with the value of $-g_{ma}$ has the input at the shunt C of the Q active-L circuit and the output at the shunt C of the said I active-L circuit;
   the said second transconductor of first pair with the value of $+g_{ma}$ has the input at the shunt C of the I C-L circuit and the output at the shunt C of the said Q C-L circuit; and
   the said second transconductor of second pair with the value of $+g_{ma}$ has the input at the shunt C of the I active-L circuit and the output at the shunt C of the said Q active-L circuit.

7. The continuous-time active complex bandpass ladder filter with transmission zeros of claim 6 and further including:

at least one pair of series C's added one pair at a time, in parallel to a pair of series L of C-L circuits, forming a pair of C-LC circuits; and at least one pair of differential transconductors.

8. The continuous-time active complex bandpass ladder filter with transmission zeros of claim 7 wherein:

the said first differential transconductor with the value of $-g_{mb}$ has the input at the + and—contacts of series C of the Q C-LC circuit and the output at the + and—contacts of series C of the said I C-LC circuit;

the said second differential transconductor with the value of $+g_{mb}$ has the input at the + and—contacts of series C of the I C-LC circuit and the output at the + and—contacts of series C of the said Q C-LC circuit.

9. The continuous-time active complex bandpass ladder filter with transmission zeros of claim 8 and further including:

a pair of shunt C's connected to the $1/g_m$ load resistors: first fed with a single-ended I signal and second fed with a single-ended Q signal shifted 90 degrees with respect to I;

and a pair of single-ended transconductors.

10. The continuous-time active complex bandpass ladder filter with transmission zeros of claim 9 wherein:

said first transconductor with the value of $-g_{ma}$ has the input at the Q shunt C and the output at the I shunt C; and the said second transconductor with the value of $+g_{ma}$ has the input at the I shunt C and the output at the Q shunt C.

11. The continuous-time active complex bandpass ladder filter with transmission zeros of claim 3 wherein said ladder filter is differential.

12. The continuous-time active complex bandpass ladder filter with transmission zeros of claim 11 further including one or more sets selected from the group consisting of:

two shunt C series L circuits connected to the source resistor: first fed with differential I signals and second fed with differential Q signals shifted 90 degrees with respect to I;

and two pairs of differential transconductors connected to the source resistor.

13. The continuous-time active complex bandpass ladder filter with transmission zeros of claim 12 wherein:

the said first transconductor of first pair with the value of $-g_{ma}$ has the input at the + and − shunt C's of the Q C-L circuit and the output at the + and − shunt C's of the said I C-L circuit;

the said first transconductor of second pair with the value of $-g_{ma}$ has the input at the + and − shunt C's of the Q active-L circuit and the output at the + and − shunt C's of the said I active-L circuit;

the said second transconductor of first pair with the value of $+g_{ma}$, has the input at the + and − shunt C's of the I C-L circuit and the output at the + and − shunt C's of the said Q C-L circuit; and the said second transconductor of second pair with the value of $+g_{ma}$ has the input at the + and − shunt C's of the I active-L circuit and the output at the + and − shunt C's of the said Q active-L circuit.

14. The continuous-time active complex bandpass ladder filter with transmission zeros of claim 13 and further including:

at least one pair of series C's added one double pair at a time, in parallel to double pairs of series L's of differential C-L circuits forming differential C-LC circuits; and at least one double pair of differential transconductors.

15. The continuous-time active complex bandpass ladder filter with transmission zeros of claim 14 wherein:

the said first transconductor with the value of $-g_{mb}$ has the inputs at the + and − contacts of the series C of the Q+ C-LC circuit and the output at the + and − contacts of the series C of the said I+ C-LC circuit;

the said second transconductor with the value of $-g_{mb}$ has the inputs at the − and + contacts of the series C of the Q− C-LC circuit and the output at the − and + contacts of the series C of the said I− C-LC circuit;

the said third transconductor with the value of $+g_{mb}$ has the inputs at the + and − contacts of the series C of the I+ C-LC circuit and the outputs at the + and − contacts of the series C of the said Q+ C-LC circuit; and the said fourth transconductor with the value of $+g_{mb}$ has the inputs at the − and + contacts of the series C of the I⁻ C-LC circuit and the outputs at the − and + contacts of the series C of the said Q⁻ C-LC circuit.

16. The continuous-time active complex bandpass ladder filter with transmission zeros of claim 15 and further including:

two pairs of shunt C's connected to the $1/g_m$ load resistors: first pair fed with differential I signals and second pair fed with differential Q signals shifted 90 degrees with respect to I; and a pair of differential transconductors.

17. The continuous-time active complex bandpass ladder filter with transmission zeros of claim 16 wherein:

the said first differential transconductor with the value of $-g_{ma}$ has the input at the + and − Q shunt C's and the output at the + and − I shunt C's; and the said second differential transconductor with the value of $+g_{ma}$ has the input at the + and − I shunt C's and the output at the + and − Q shunt C's.

18. The continuous-time active complex bandpass ladder filter of claim 10 which said ladder filter is a 2*(2N+1) th-Order with up to 2N transmission zeros and further including N double (I and Q) C-LC circuits, or C-L circuits and one double shunt C circuit all equipped with shifting transconductors $g_{ma}$ and $g_{mb}$, where N is an integer number grater than or equal to 1.

19. The continuous-time active complex bandpass ladder filter with transmission zeros of claim 17 wherein said ladder filter is a 2*(2N+1) th-Order with up to 2N transmission zeros and further including N double (I and Q) C-LC circuits, or C-L circuits and one double shunt C circuit all equipped with shifting transconductors $g_{ma}$ and $g_{mb}$, where N is an integer number grater than or equal to 1.

* * * * *